US008097948B2

(12) United States Patent
Furusawa et al.

(10) Patent No.: US 8,097,948 B2
(45) Date of Patent: *Jan. 17, 2012

(54) SEMICONDUCTOR DEVICE AND MANUFACTURING METHOD OF SEMICONDUCTOR DEVICE

(75) Inventors: Takeshi Furusawa, Tokyo (JP); Daisuke Kodama, Tokyo (JP); Masahiro Matsumoto, Tokyo (JP); Hiroshi Miyazaki, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/880,520

(22) Filed: Sep. 13, 2010

(65) Prior Publication Data

US 2010/0327449 A1 Dec. 30, 2010

Related U.S. Application Data

(63) Continuation of application No. 12/714,039, filed on Feb. 26, 2010, now Pat. No. 7,816,268, which is a continuation of application No. 11/622,767, filed on Jan. 12, 2007, now Pat. No. 7,700,487.

(30) Foreign Application Priority Data

Jan. 13, 2006 (JP) ................................. 2006-005956

(51) Int. Cl.
*H01L 23/48* (2006.01)
*H01L 21/44* (2006.01)
(52) U.S. Cl. ........ 257/751; 257/750; 257/762; 438/627; 438/638; 438/687

(58) Field of Classification Search .................. 438/622, 438/627, 629, 638, 643, 648, 656, 685, 687; 257/750, 751, 753, 758, 761–765
See application file for complete search history.

(56) References Cited

U.S. PATENT DOCUMENTS 6,008,114 A * 12/1999 Li ................................. 438/618
6,136,104 A * 10/2000 Miyafuji et al. ............. 148/433
6,818,991 B1 * 11/2004 Kikuta ......................... 257/751

(Continued)

FOREIGN PATENT DOCUMENTS

JP 11307530 A * 11/1999

(Continued)

*Primary Examiner* — Kevin M Picardat
(74) *Attorney, Agent, or Firm* — Oblon, Spivak, McClelland, Maier & Neustadt, L.L.P.

(57) ABSTRACT

To provide a semiconductor device having a structure in which a barrier metal film containing nitrogen is formed in a connection surface between a copper alloy wiring and a via, in which the electric resistance between the copper alloy wiring and the via can be prevented from rising, and the electric resistance can be prevented from varying. A semiconductor device according to the present invention comprises a first copper alloy wiring, a via and a first barrier metal film. The first copper alloy wiring is formed in an interlayer insulation film and contains a predetermined additive element in a main component Cu. The via is formed in an interlayer insulation film and electrically connected to the upper surface of the first copper alloy wiring. The first barrier metal film is formed so as to be in contact with the first copper alloy wiring in the connection part between the first copper alloy wiring and the via and contains nitrogen. The predetermined additive element reacts with nitrogen to form a high-resistance part. In addition, the concentration of the predetermined additive element is not more than 0.04 wt %.

15 Claims, 20 Drawing Sheets

U.S. PATENT DOCUMENTS

| | | | |
|---|---|---|---|
| 7,192,871 B2 * | 3/2007 | Maekawa et al. | 438/695 |
| 7,332,428 B2 * | 2/2008 | Beck | 438/637 |
| 7,700,487 B2 * | 4/2010 | Furusawa et al. | 438/687 |
| 2002/0096768 A1 * | 7/2002 | Joshi | 257/750 |
| 2003/0100181 A1 * | 5/2003 | Park et al. | 438/639 |
| 2004/0159951 A1 * | 8/2004 | Toyoda et al. | 257/762 |
| 2007/0020931 A1 * | 1/2007 | Koura et al. | 438/687 |
| 2007/0037374 A1 * | 2/2007 | Hayashi et al. | 438/597 |

FOREIGN PATENT DOCUMENTS

| | | | |
|---|---|---|---|
| JP | 2002075995 A | * | 3/2002 |
| JP | 2003124313 A | * | 4/2003 |

* cited by examiner

F I G . 1
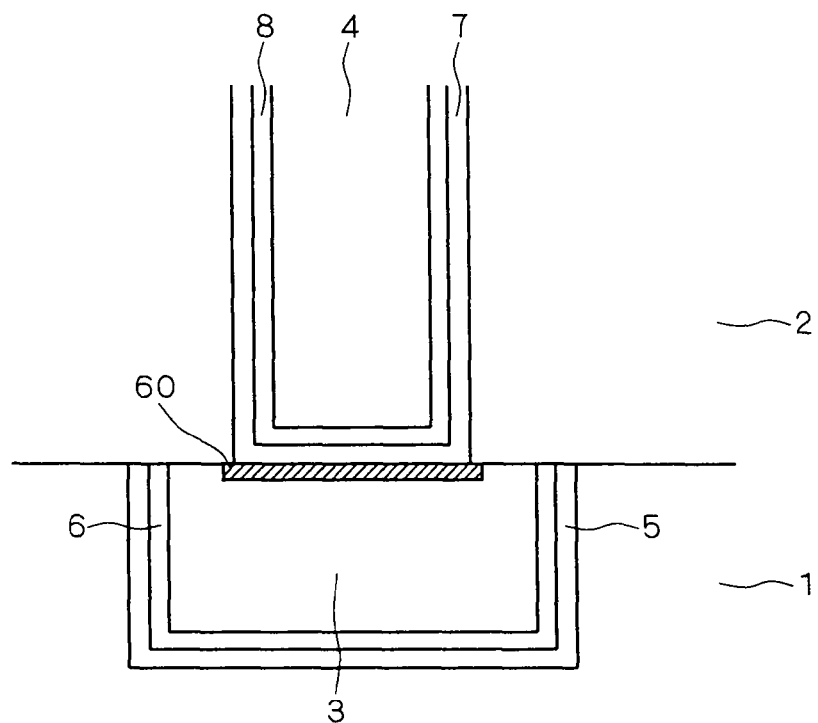
F I G . 2
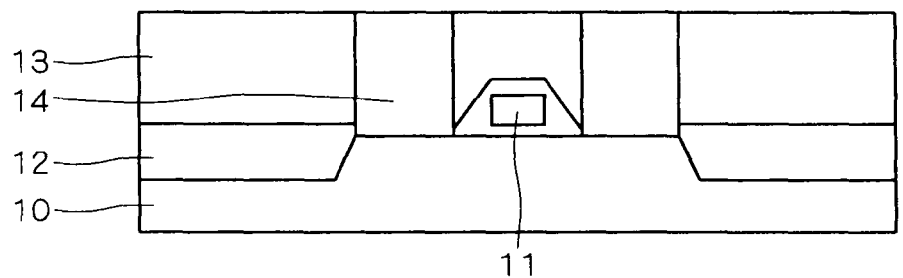

F I G . 3
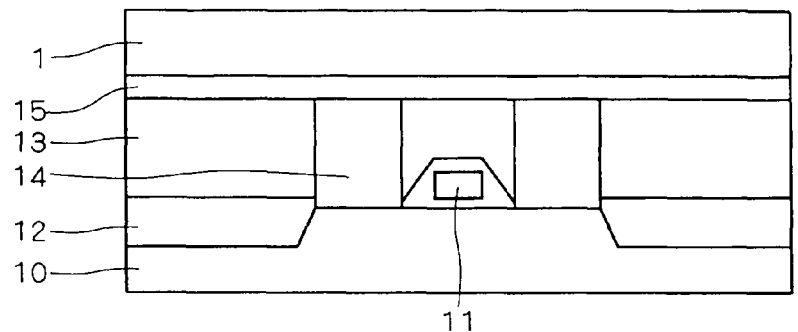
F I G . 4
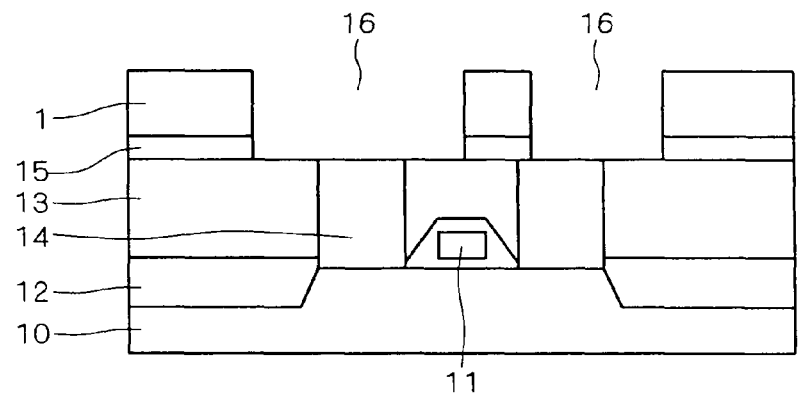
F I G . 5
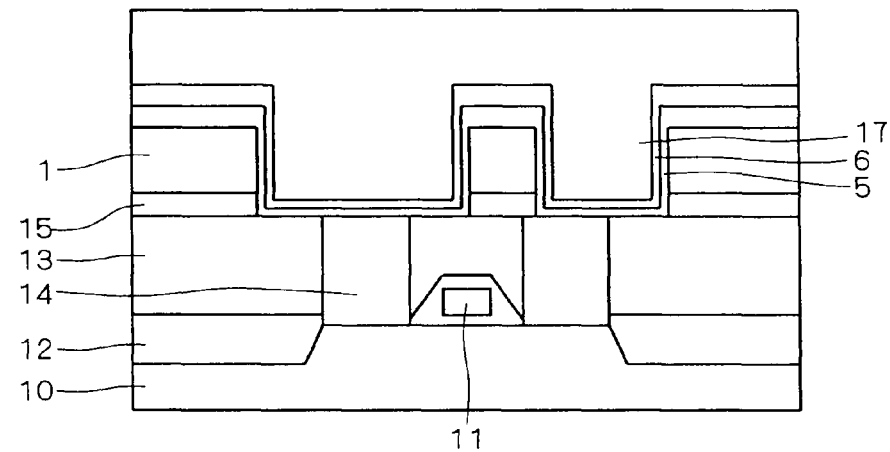

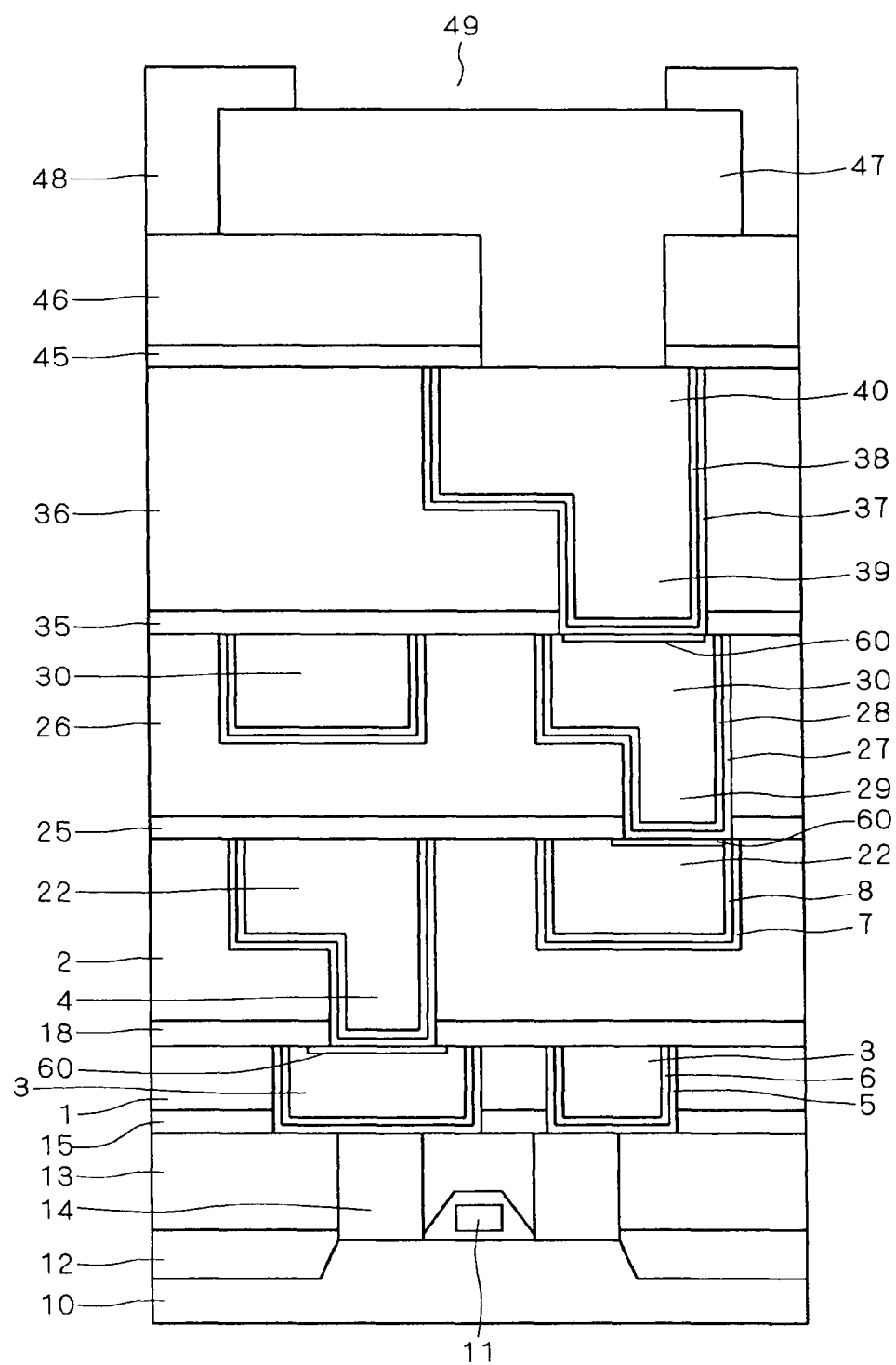
F I G . 1 3

F I G . 2 2
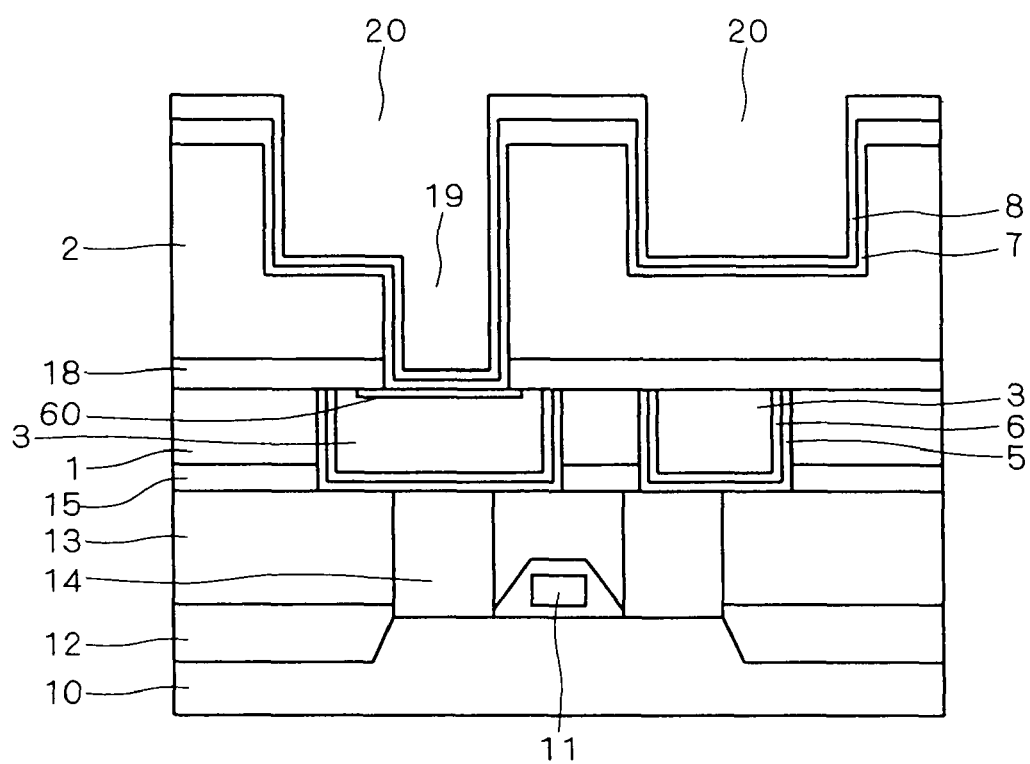

F I G . 2 5
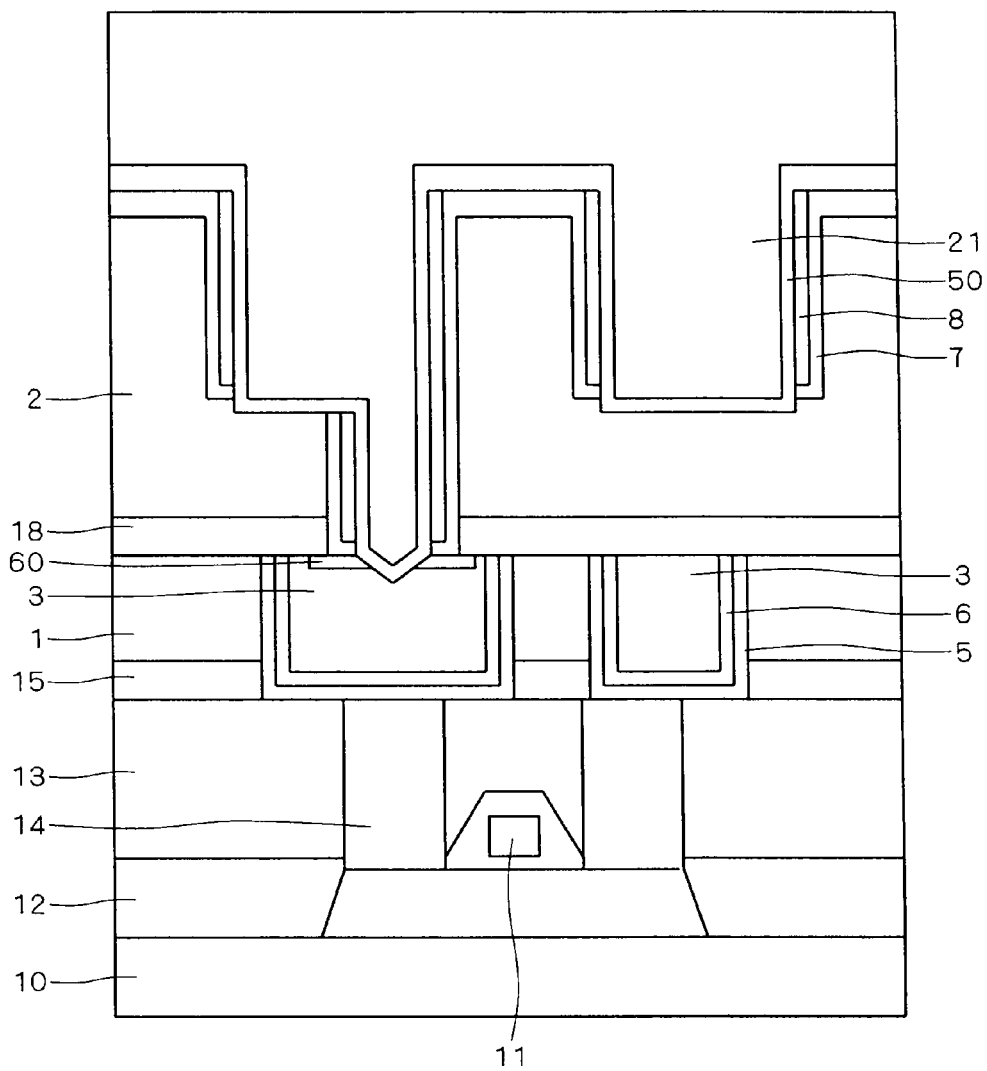

F I G . 2 6
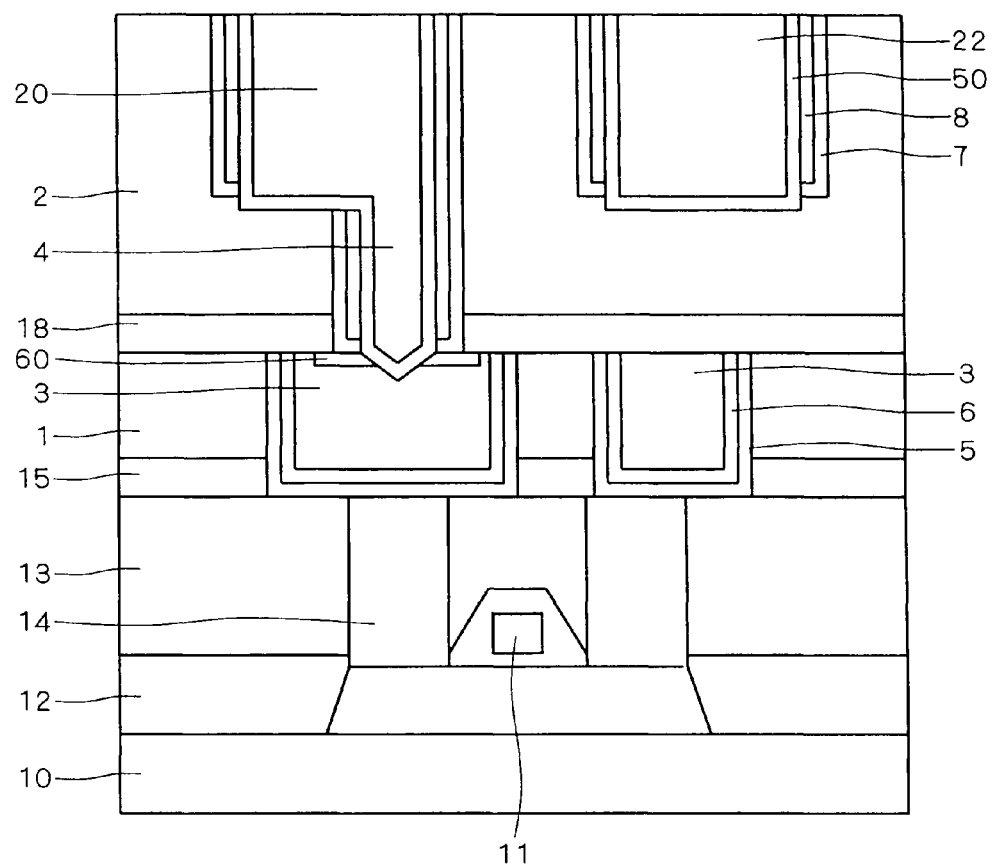

F I G . 2 7
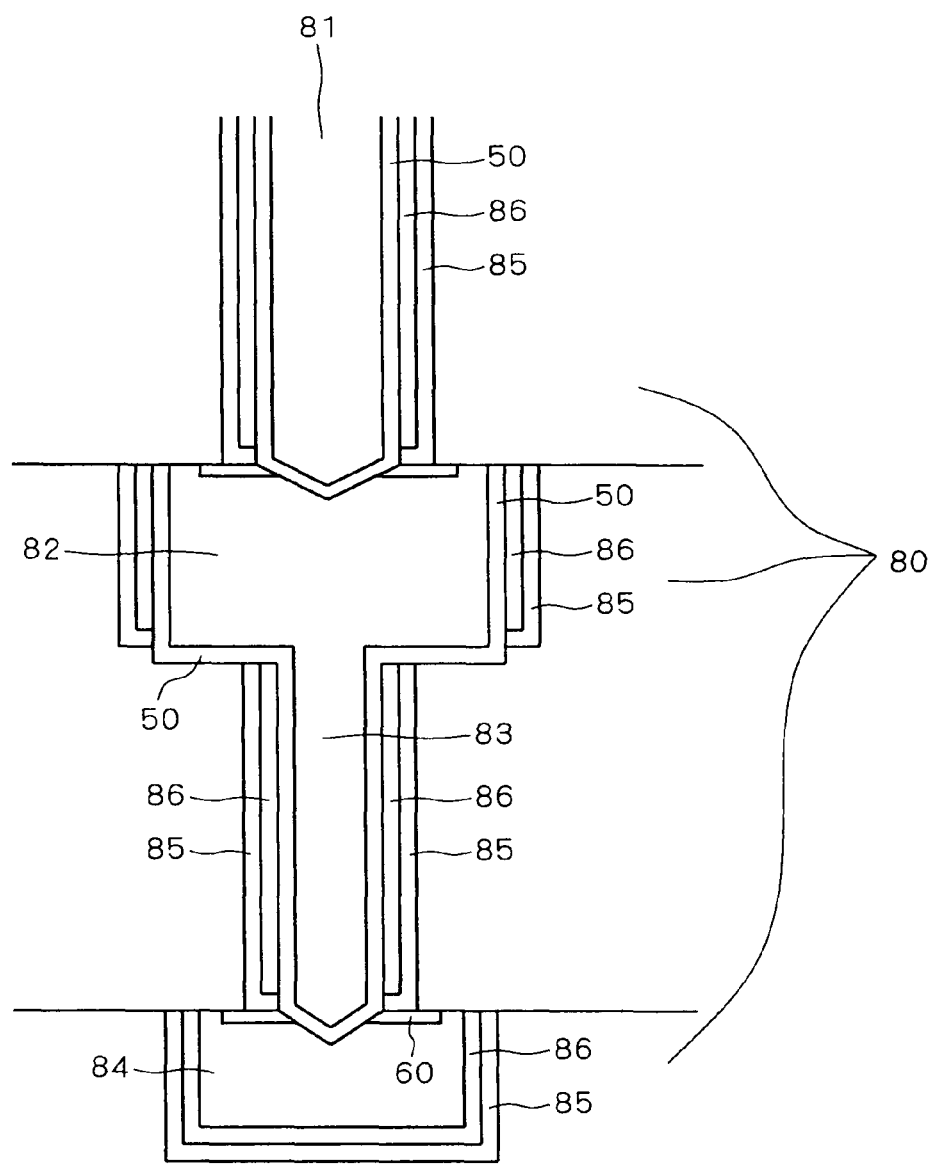

SEMICONDUCTOR DEVICE AND MANUFACTURING METHOD OF SEMICONDUCTOR DEVICE

CROSS-REFERENCE TO RELATED APPLICATION

The present application claims priority from Japanese application No. 2006-5956 filed on Jan. 13, 2006, the contents of which are hereby incorporated by reference into this application.

BACKGROUND OF THE INVENTION

1. Field of the Invention

The present invention relates to a semiconductor device and a manufacturing method of the semiconductor device and more particularly, to a semiconductor device having a copper alloy wiring and a via connected to the copper alloy wiring and a manufacturing method of that semiconductor device.

2. Description of the Background Art

Since a multilayer wiring structure using copper having low resistance is used in a semiconductor device requiring a high speed operation and low power consumption in order to prevent a signal delay and to reduce the power consumption at a wiring part. However, as the semiconductor device is miniaturized, a current density flowing in the copper wiring is increased and reliability of the copper wiring against electromigration (referred to as the EM, hereinafter) becomes critical.

The EM is a phenomenon in which when a current flows in the copper wiring, a copper atom is pressed by the electron flow and moved. EM resistance in the contact surface between the bottom of the interlayer connection (via) connecting upper and lower wirings and the lower copper wiring is the most controversial in the copper wiring. When the EM phenomenon occurs, the copper atom in the copper wiring is moved and a void is formed in the vicinity of the contact surface of the copper wiring. Then, as a result of the void, the copper wiring and the via are electrically opened.

In order to prevent the opening between the copper wiring and the via due to the EM phenomenon, a current flowing to the copper wiring has been limited conventionally. In addition, a copper alloy wiring to which an additive element such as aluminum is added to a main component Cu has been used. Such copper alloy wiring is disclosed in non-Patent document 1 (T. Tonegawa et al (NEC), "Suppression of Bimodal Stress-Induced Voiding Using Highly Diffusive Dopant from Cu-Alloy Seed Layer", Proceeding of IEEE International Interconnect Technology Conference 2003, pp. 216-218). EM resistance in the copper alloy wiring is superior to that in a pure copper wiring.

The non-Patent document 1 discloses a technique for improving the EM resistance by using a copper alloy wiring to which Al, Sn and Ti are added as additive elements to copper as a main component. In addition, Japanese Patent Application Laid-Open No. 2002-75995 and No. 11-307530 disclose the other techniques on the copper alloy wiring.

For example, the Japanese Patent Application Laid-Open No. 2002-75995 discloses a structure in which a copper alloy wiring and a via connected to the upper surface of the copper alloy wiring are formed in an interlayer insulation film, and a barrier metal film containing nitrogen is formed in the contact surface (can be grasped as a connection part) between the copper alloy wiring and the via.

Furthermore, the barrier metal film existing between the copper alloy wiring (including the via) and the interlayer insulation film has been also devised variously. For example, as the barrier metal film, a film having a laminated structure in which TaN, TiN, WN and the like that are highly adherent to the interlayer insulation film and Ta, Ti W and the like that are highly adherent to copper are laminated is employed (Japanese Patent Application Laid-Open No. 2003-124313)

However, in the case of the structure disclosed in the Japanese Patent Application Laid-Open No. 2002-75995, it has been found that the following problem arises from the experiment by the inventors. That is, when the barrier metal film containing nitrogen is formed on the contact surface between the copper alloy wiring and the via, the electric resistance between the copper alloy wiring and the via rises and the electric resistance varies.

SUMMARY OF THE INVENTION

It is an object of the present invention to provide a semiconductor device having a structure in which a copper alloy wiring and a via connected to the upper surface of the copper alloy wiring are formed in an interlayer insulation film, and a barrier metal film containing nitrogen is formed in the connection surface (can be grasped as a connection part) between the copper alloy wiring and the via, in which the electric resistance between the copper alloy wiring and the via can be prevented from rising, and the electric resistance can be prevented from varying. In addition, it is an object of the present invention to provide a manufacturing method of the above semiconductor device.

According to a first aspect of the present invention, a semiconductor device comprises a first copper alloy wiring, a via, and a first barrier metal film. The first copper alloy wiring is formed in an interlayer insulation film and contains a predetermined additive element in a main component Cu. The via is formed in an interlayer insulation film and electrically connected to the upper surface of the first copper alloy wiring. The first barrier metal film is formed so as to be in contact with the first copper alloy wiring in the connection part between the first copper alloy wiring and the via and contains nitrogen. In addition, the concentration of the predetermined additive element is not more than 0.04 wt %.

The reaction between nitrogen and the additive element can be prevented in the connection part between the first copper alloy wiring and the via. That is, the high-resistance part can be prevented from being formed. Thus, the electric resistance in the connection part can be prevented from rising and the electric resistance can be prevented from varying.

According to a second aspect of the present invention, a semiconductor device comprises a first copper alloy wiring, a second interlayer insulation film, and a second copper alloy wiring. The first copper alloy wiring is provided in a first interlayer insulation film and contains Al in a main component Cu. The second interlayer insulation film is formed on the first interlayer insulation film. The second copper alloy wiring is provided in the second interlayer insulation film and contains Al in a main component Cu. Furthermore, the concentration of the Al in the second copper alloy wiring is less than the concentration of the Al in the first copper alloy wiring.

The resistance value of the second copper alloy wiring provided in the upper layer can be smaller than the resistance value of the first copper alloy wiring provided in the lower layer.

According to a third aspect of the present invention, a semiconductor device comprises a copper alloy wiring, a second interlayer insulation film, and a copper wiring. The copper alloy wiring is provided in a first interlayer insulation film and containing Al in a main component Cu. The second interlayer insulation film is formed on the first interlayer insulation film. The copper wiring is provided in the second interlayer insulation film and having a film thickness larger than that of the copper alloy wiring and not containing Al.

The resistance value of the second copper alloy wiring provided in the upper layer can be smaller than the resistance value of the first copper alloy wiring provided in the lower layer.

According to a fourth aspect of the present invention, a semiconductor device comprises a first dual damascene structure, a second interlayer insulation film, and a second dual damascene structure. The first dual damascene is provided in a first interlayer insulation film and comprises a first wiring and a first via and contains Al in a main component Cu. The second interlayer insulation film is formed on the first interlayer insulation film. The second dual damascene structure is provided in the second interlayer insulation film and comprises a second wiring having film thickness thicker than that of the first wiring and a second via and does not contain Al. Here, the upper part of the first wiring and the lower surface of the second via are connected.

The resistance value of the second dual damascene structure provided in the upper layer can be smaller than the resistance value of the first dual damascene structure provided in the lower layer.

According to a fifth aspect of the present invention, a semiconductor device comprises a first via, a first copper alloy wiring, a first barrier metal film, and a second barrier metal film. The first via is formed in an interlayer insulation film and contains Al in a main component Cu. The first copper alloy wiring is formed in the interlayer insulation film, electrically connected to the bottom of the first via, and contains Al in a main component Cu. The first barrier metal film is formed so as to be in contact with the interlayer insulation film between the interlayer insulation film and the first via and contains nitrogen. The second barrier metal film is formed so as to be in contact with the first via between the interlayer insulation film and the first via and does not contains nitrogen. The first barrier metal film is not formed in the connection part between the first copper alloy wiring and the first via. The second barrier metal film is also formed in the connection part between the first copper alloy wiring and the first via.

The reaction between nitrogen and Al can be prevented in the connection part between the first copper alloy wiring and the first via. That is, the high-resistance part can be prevented from being formed. Thus, the electric resistance in the connection part can be prevented from rising and the electric resistance can be prevented from varying.

According to a sixth aspect of the present invention, a manufacturing method of a semiconductor device comprises steps (A) to (D). At the step (A), a copper alloy wiring containing copper as a main component and an additive element having a concentration of 0.04 wt % or less is formed in a first interlayer insulation film. At the step (B), a connection hole from which the upper surface of the copper alloy wiring is exposed is formed in a second interlayer insulation film formed on the first copper alloy wiring. At the step (C), a first barrier metal film containing nitrogen is formed on the bottom and side of the connection hole. At the step (D), the connection hole is filled with a conductor after the step (C).

The reaction between nitrogen and the additive element can be prevented in the connection part between the copper alloy wiring and the via. That is, the semiconductor device in which the high-resistance part can be prevented from being formed can be manufactured.

According to a seventh aspect of the present invention, a manufacturing method of a semiconductor device comprises a step (A) and a step (B). At the step (A), a first copper alloy wiring containing Al in a main component Cu is provided in a first interlayer insulation film. At the step (B), a second copper alloy wiring is formed in a second interlayer insulation film formed on the first interlayer insulation film. Here, the second copper alloy wiring contains Al in a main component Cu, has a film thickness larger than that of the first copper alloy wiring, and has an Al concentration lower than the Al concentration of the first copper alloy wiring.

The semiconductor device provided with the upper layer wiring having the resistance value smaller than the resistance value of the lower layer wiring can be manufactured.

According to an eighth aspect of the present invention, a manufacturing method of a semiconductor device comprises a step (A) and a step (B). At the step (A), a copper alloy wiring containing Al in a main component Cu is provided in a first interlayer insulation film. At the step (B), a copper wiring is formed in a second interlayer insulation film formed on the first interlayer insulation film. The copper wiring has a film thickness larger than that of the copper alloy wiring and does not contain Al.

The semiconductor device provided with the upper layer wiring having the resistance value smaller than the resistance value of the lower layer wiring can be manufactured.

According to a ninth aspect of the present invention, a manufacturing method of a semiconductor device comprises a step (A) and a step (B). At the step (A), a first dual damascene structure is formed in a first interlayer insulation film. The first dual damascene structure comprises a first wiring and a first via and contains Al in a main component Cu. At the step (B), a second dual damascene structure is formed in a second interlayer insulation film formed on the first interlayer insulation film. The second dual damascene comprises a second wiring having a film thickness larger than that of the first wiring does not contain Al, in which the upper part of the first wiring and the lower surface of the second via are connected.

The semiconductor device provided with the upper dual damascene structure having the resistance value lower than that of the lower dual damascene structure can be manufactured.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an enlarged sectional view showing a substantial constitution of a semiconductor device according to an embodiment 1;

FIG. 2 is an explanatory sectional view showing a manufacturing step of the semiconductor device according to the embodiment 1;

FIG. 3 is an explanatory sectional view showing a manufacturing step of the semiconductor device according to the embodiment 1;

FIG. 4 is an explanatory sectional view showing a manufacturing step of the semiconductor device according to the embodiment 1;

FIG. 5 is an explanatory sectional view showing a manufacturing step of the semiconductor device according to the embodiment 1;

FIG. 13 is an explanatory sectional view showing a manufacturing step of the semiconductor device according to the embodiment 1;

FIG. 22 is an explanatory sectional view showing a manufacturing step of a semiconductor device according to the embodiment 4;

FIG. 25 is an explanatory sectional view showing a manufacturing step of the semiconductor device according to the embodiment 4;

FIG. 26 is an explanatory sectional view showing a manufacturing step of the semiconductor device according to the embodiment 4; and FIG. 27 is a sectional view showing that the constitution according to the embodiment 4 is sequentially provided over a lower to upper layers;

DESCRIPTION OF THE PREFERRED EMBODIMENTS

Figure 6:
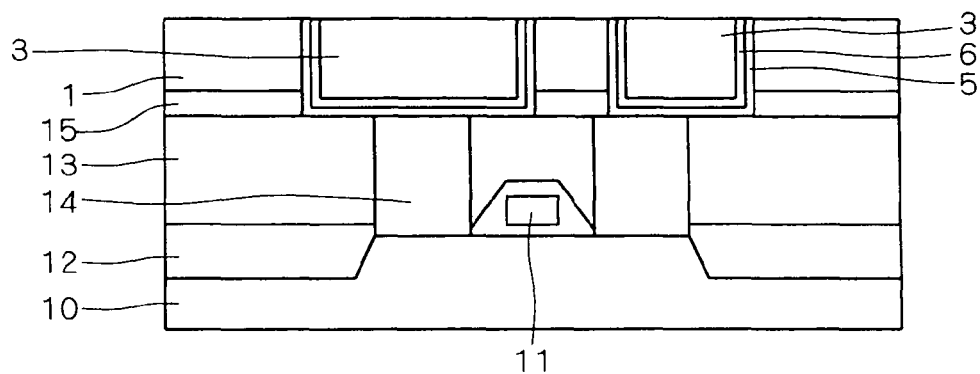
FIG. 6 is an explanatory sectional view showing a manufacturing step of the semiconductor device according to the embodiment 1.

The inventors performed an experiment to examine the electric characteristics of a semiconductor device in which a copper alloy wiring and a via connected to the upper surface of the copper alloy wiring are formed in an interlayer insulation film, and a barrier metal film containing nitrogen is formed in the connection surface (can be grasped as a connection part) between the copper alloy wiring and the via. Here, the copper alloy wiring is provided by adding an additive element such as Al to a main component, Cu.

The above experiment found that the rise in electric resistance in the connection part is caused by the following factor. That is, it was found that a high-resistance part formed by the reaction between the additive element and nitrogen was the above factor.

Furthermore, the experiment found that variations in electric resistance in the connection part depends on the concentration of the additive element.

The present invention will be described in detail with reference to the drawings showing its embodiment, hereinafter.

Embodiment 1

FIG. 1 shows an enlarged sectional view showing the constitution of a semiconductor device according to this embodiment. As shown in FIG. 1, the semiconductor device comprises interlayer insulation films 1 and 2, a copper alloy wiring 3, a via 4, barrier metal films 5 to 8.

Referring to FIG. 1, the copper alloy wiring 3 is provided in the interlayer insulation film 1. Here, the copper alloy wiring 3 comprises copper (Cu) as a main component, and a predetermined additive element is contained in the copper. The predetermined additive element reacts with nitrogen to form an insulation film (referred to as the high-resistance part hereinafter). The predetermined additive element includes Al, Si, Ge, Ga, Sn and the like. In addition, the concentration (rate of content) of the predetermined additive element is not more than 0.04 wt % but not less than 0.01 wt % in view of a concentration value provided from the measured result by ICP emission spectrometry.

Furthermore, as shown in FIG. 1, the via 4 is formed in the interlayer insulation film 2. Here, the bottom of the via 4 is electrically connected to the upper surface of the copper alloy wiring 3.

Still furthermore, as shown in FIG. 1, the first barrier metal film 5 and second barrier metal film 6 are formed between the copper alloy wiring 3 and the interlayer insulation film 1. In addition, the first barrier metal film 7 and second barrier metal film 8 are formed between the via 4 and the interlayer insulation film 2.

Each of the first barrier metal films 5 and 7 comprises a conduction film containing nitrogen, and each of the second barrier metal films 6 and 8 comprises a conduction film not containing nitrogen.

Here, the first barrier metal film 5 is formed on the side of the interlayer insulation film 1 (that is, in contact with the interlayer insulation film 1), and the first barrier metal film 7 is formed on the side of the interlayer insulation film 2 (that is, in contact with the interlayer insulation film 2). Furthermore, the second barrier metal film 6 is formed on the side of the copper alloy wiring 3 (that is, in contact with the copper alloy wiring 3) and the second barrier metal film 8 is formed on the side of the via 4 (that is, in contact with the via 4). In addition, the first barrier metal film 7 and the second barrier metal film 8 are formed at the connection part between the copper alloy wiring 3 and the via 4.

Furthermore, the concentration of the nitrogen contained in the first barrier metal films 5 and 7 is not less than 10 atom % but not more than 40 atom %. In addition, the film thickness of the first barrier metal films 5 and 7 (especially, the first barrier metal films 5 and 7 formed on the sides of the copper alloy wiring 3 and the via 4, respectively) is not less than 1 nm but not more than 10 nm.

As can be clear from FIG. 1 also, the first barrier metal film 7 is formed at the connection part between the upper surface of the copper alloy wiring 3 and the bottom of the via 4. Here, the first barrier metal film 7 is in contact with the copper alloy wiring 3 over the entire surface of the connection part. In addition, the first barrier metal film 7 contains nitride as described above.

In addition, as shown in FIG. 1, focusing on the connection part between the copper alloy wiring 3 and the via 4, a high-resistance part 60 is formed at a part of the upper surface of the copper alloy wiring 3. The high-resistance part 60 is formed when the additive element contained in the copper alloy wiring 3 reacts with nitrogen contained in the first barrier metal film 7.

Here, the first barrier metal films 5, 7, 27 and 37 containing nitrogen are highly adherent to interlayer insulation films 1, 2, 26 and 36, respectively and they are TaN, TiN, WN and the like.

The second barrier metal films 6, 8, 28, 38 and the like not containing nitrogen are highly adherent to the copper alloy wirings 3, 22, 23 (copper wiring 40) and vias 4 and 29 (copper via 39). As the second barrier metal films 6, 8, 28, 38 and the like, Ta, Ti, W and the like may be used.

In addition, the second barrier metal film 8 is in contact with the via 4 at the connection part between the copper alloy wiring 3 and the via 4.

Next, a manufacturing method of the semiconductor device having the constitution shown in FIG. 1 will be described.

In addition, the following copper alloy wiring has the same constitution as that of the copper alloy wiring 3. Furthermore, the following first barrier metal film has the same constitution as that of the first barrier metal films 5 and 7. Still furthermore, the following second barrier metal film has the same constitution as that of the second barrier metal films 6 and 8.

First, as shown in FIG. 2, a semiconductor substrate 10 on which a transistor comprising a gate electrode 11 is formed is prepared. Here, an element isolation film 12 is formed in the semiconductor substrate 10.

Furthermore, as shown in FIG. 2, a silicon oxide film (insulation film) 13 is formed on the semiconductor substrate 10. Then, as shown in FIG. 2, a contact electrode 14 is formed in the silicon oxide film 13. Here, the contact electrode 14 is electrically connected to an active region (not shown) formed in the semiconductor substrate 10.

Then, as shown in FIG. 3, a silicon carbonitride film 15 and the interlayer insulation film 1 having a low dielectric constant are formed on the silicon oxide film 13 in this order. Then, as shown in FIG. 4, a trench pattern 16 is formed in the silicon carbonitride film 15 and the interlayer insulation film 1. Here, the trench pattern 16 is formed by photolithography technique and a dry etching process.

Then, the first barrier metal film 5 is formed on the bottom and side of the trench pattern 16 and on the interlayer insulation film 1 (FIG. 5). Here, the first barrier metal film 5 is the conduction film containing nitrogen and tantalum nitride may be used for it, for example.

In addition, the second barrier metal film 6 is formed on the first barrier metal film 5 (FIG. 5). Here, the second barrier metal film 6 is the conduction film not containing nitrogen and tantalum may be used for it, for example.

Then, as shown in FIG. 5, a copper alloy 17 is formed on the second barrier metal film 6 so that the trench pattern 16 is filled with it. Here, the copper alloy 17 contains the predetermined additive element (Al in this embodiment) that reacts with nitrogen to form the insulation film (high-resistance part 60). Therefore, the copper alloy 17 is Cu—Al alloy containing copper as a main component in this embodiment.

The Cu—Al alloy can be formed as follows.

First, the semiconductor device in which the second barrier metal film 6 has been formed is sputtered. In this sputtering process, a Cu—Al alloy film becoming a seed film is formed on the second barrier metal film 6. Here, the concentration of the additive element (Al) contained in the Cu—Al alloy film is higher than a target concentration (this is the concentration of the predetermined additive element (Al) contained in the copper alloy wiring 3 to be formed finally and it is not more than 0.04 wt % but not less than 0.01 wt %).

Next, electroplating is performed with the Cu—Al alloy film serving as a seed film. In this electroplating, copper is formed so that the trench pattern 16 is filled with it. After the electroplating, the semiconductor device is annealed at about 350° C. In this annealing process, the copper in the trench pattern 16 becomes a Cu—Al alloy. In addition, in this annealing process, the concentration of the additive element (Al) in the Cu—Al alloy is diluted as compared with that of the seed film and the concentration of the additive element becomes the above target concentration.

After the Cu—Al alloy 17 has been formed, a chemical mechanical polishing (CMP) process is performed on the Cu—Al alloy 17 and the first and second barrier metal films 5 and 6. Thus, as shown in FIG. 6, the Cu—Al alloy 17, the second barrier metal film 6 and the first barrier metal film 5 outside the trench pattern 16 (that is, on the interlayer insulation film 1) are removed and the copper alloy wiring 3 is provided in the interlayer insulation film 1.

Figure 7:
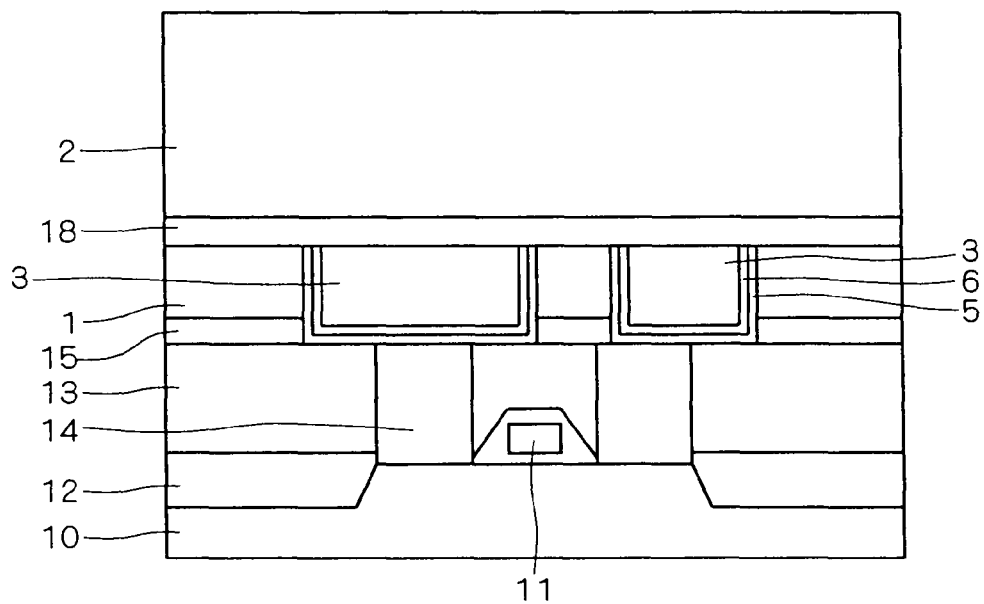
FIG. 7 is an explanatory sectional view showing a manufacturing step of the semiconductor device according to the embodiment 1.
Figure 8:
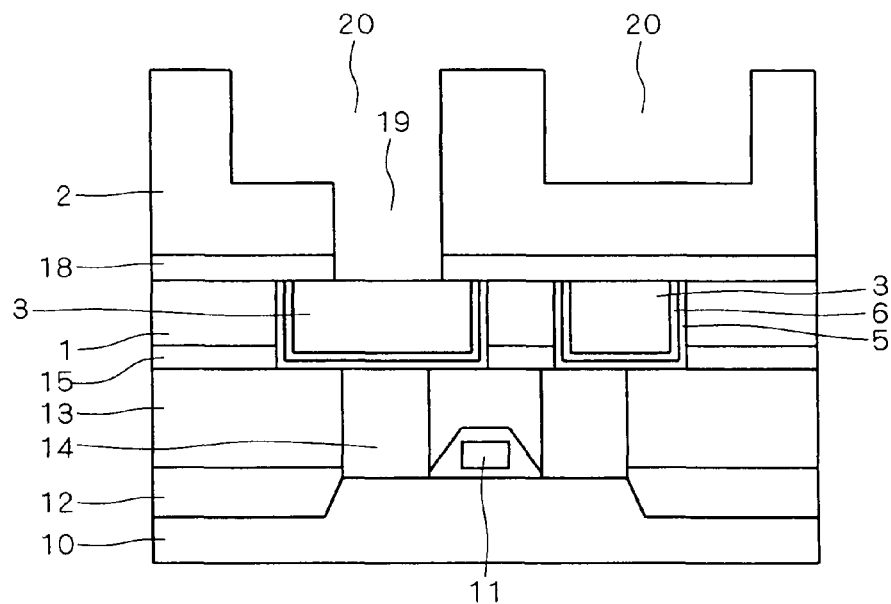
FIG. 8 is an explanatory sectional view showing a manufacturing step of the semiconductor device according to the embodiment 1.

Next, as shown in FIG. 7, a silicon carbonitride film 18 and the interlayer insulation film 2 having a low dielectric constant are formed on the interlayer insulation film 1 in this order so as to cover the copper alloy wiring 3. Then, as shown in FIG. 8, a connection hole 19 and a trench pattern 20 are formed in the silicon carbonitride film 18 and the interlayer insulation film 2. Here, the connection hole 19 and the trench pattern 20 are formed by the well-known dual damascene method that is a combination of the photolithography technique with dry etching process.

Figure 9:
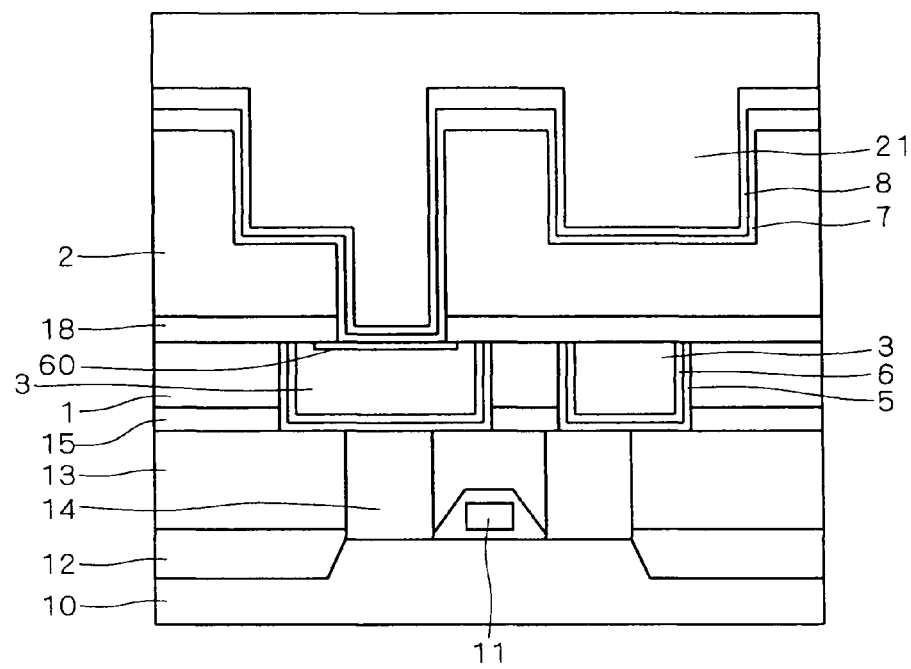
FIG. 9 is an explanatory sectional view showing a manufacturing step of the semiconductor device according to the embodiment 1.

Next, the first barrier metal film 7 is formed on the bottom and side of the trench pattern 20, on the bottom and side of the connection hole 19, and on the interlayer insulation film 2 (FIG. 9). Here, the first barrier metal film 7 is the conduction film containing nitride and tantalum nitride may be used for it. In addition, when the first barrier metal film 7 is formed, the high-resistance part 60 is formed on the upper surface of the copper alloy wiring 3 that is in contact with the first barrier metal film 7. More specifically, the high-resistance part 60 is formed by the reaction between the additive element (Al) added to the copper alloy wiring 3 and nitrogen contained in the first barrier metal film 7.

Then, the second barrier metal film 8 is formed on the first barrier metal film 7 (FIG. 9). Here, the second barrier metal film 8 is the conduction film not containing nitrogen and tantalum may be used for it.

Next, as shown in FIG. 9, a copper alloy 21 such as a Cu—Al alloy is formed on the second barrier metal film 8 so that the connection hole 19 and the trench pattern 20 are filled with it. In addition, the copper alloy 21 is formed by performing the electrolytic plating and annealing processes after a predetermined seed film has been formed similar to the forming method of the above Cu—Al alloy 17.

After the copper alloy 21 has been formed, the chemical mechanical polishing (CMP) process is performed on the copper alloy 21 and the first and second barrier metal films 7 and 8. Thus, as shown in FIG. 10, the copper alloy 21, the second barrier metal film 8 and the first barrier metal film 7 outside the trench pattern 20 (that is, on the interlayer insulation film 2) are removed and the copper alloy wiring 22 and the via 4 (this via 4 can be grasped as a copper alloy such as a Cu—Al alloy) are formed in the interlayer insulation film 2.

Figure 10:
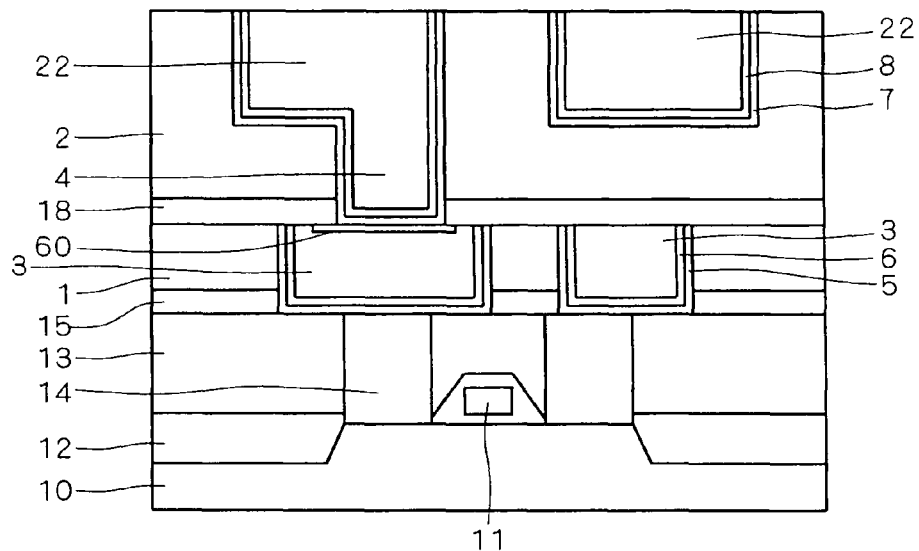
FIG. 10 is an explanatory sectional view showing a manufacturing step of the semiconductor device according to the embodiment 1.
Figure 11:
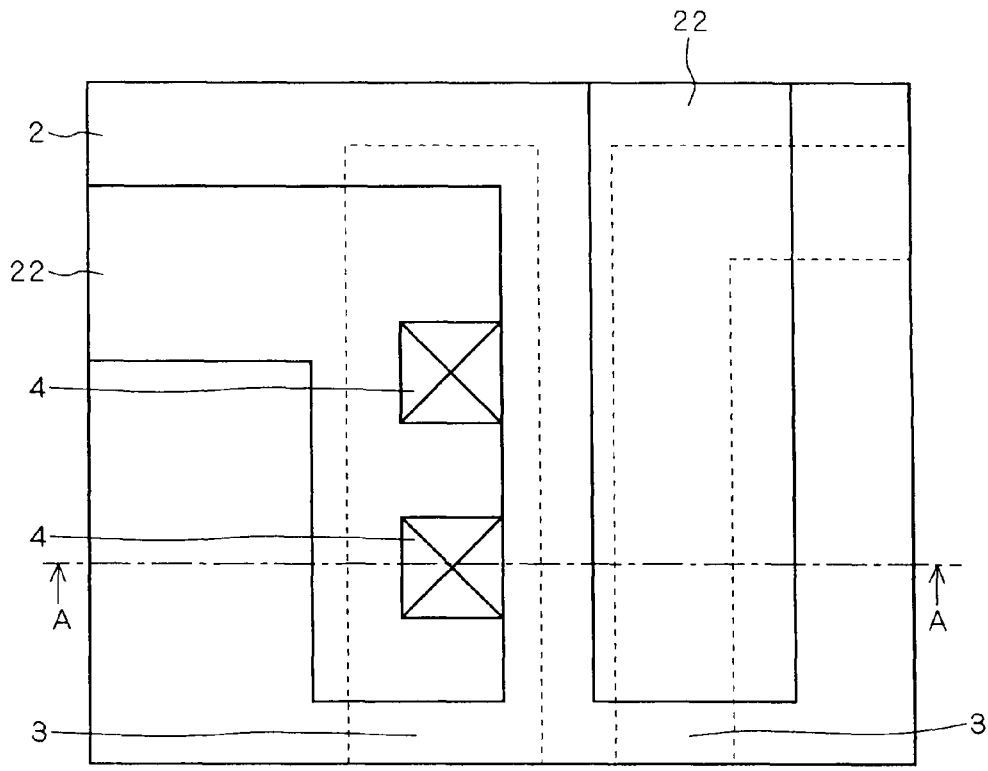
FIG. 11 is a top plan view showing the semiconductor device being manufactured.

In addition, FIG. 11 is a top plan view showing the semiconductor device being manufactured shown in FIG. 10. Here, the outline of the copper alloy wiring 3 existing in a lower layer is shown by a dotted line.

Figure 12:
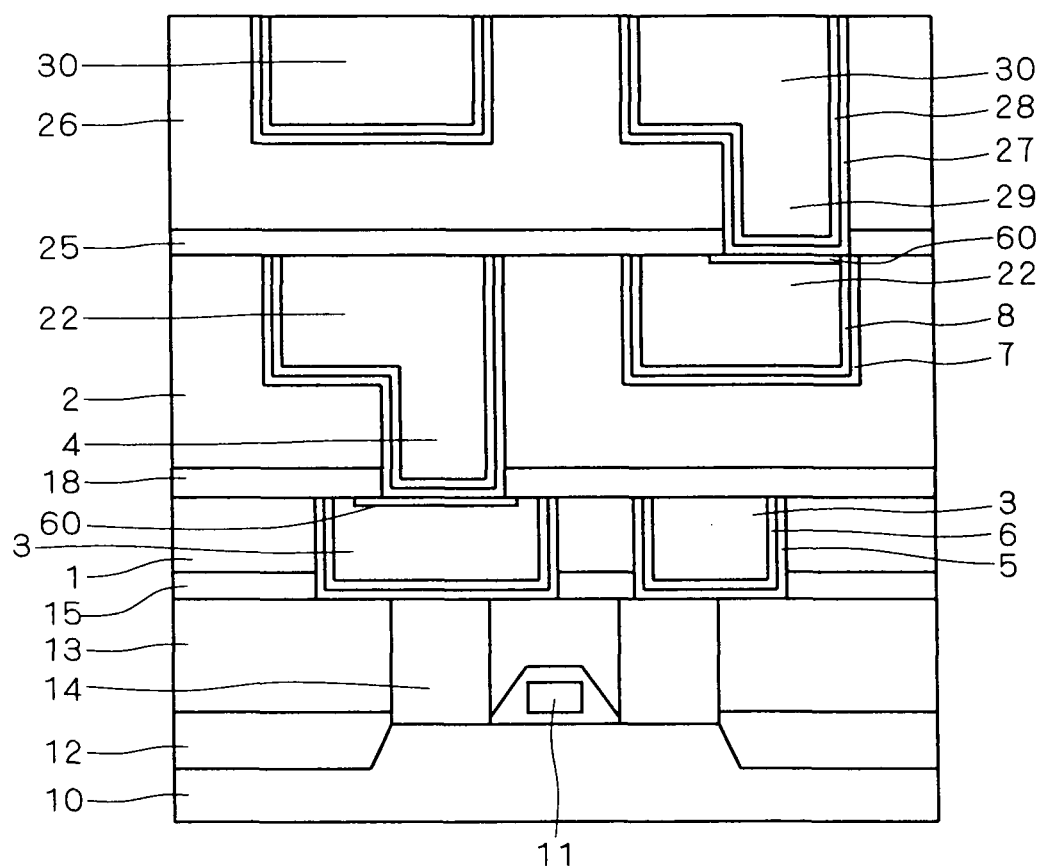
FIG. 12 is an explanatory sectional view showing a manufacturing step of the semiconductor device according to the embodiment 1.

Then, a silicon carbonitride film 25 and the interlayer insulation film 26 having a low dielectric constant are formed on the interlayer insulation film 2 in this order so as to cover the copper alloy wiring 22 (FIG. 12). Then, a connection hole (not shown) and a trench pattern (not shown) are formed in the silicon carbonitride film 25 and the interlayer insulation film 26. Here, the connection hole and the trench pattern are formed by the dual damascene method that is a combination of the photolithography technique with dry etching process.

Then, following the procedures described above with reference to FIG. 9, the first barrier metal film 27, the second barrier metal film 28 and a copper alloy such as a Cu—Al alloy are formed. Then, the chemical mechanical polishing (CMP) process is performed on the copper alloy and the first and second barrier metal films 27 and 28. Thus, as shown in FIG. 12, a copper alloy 30 and a copper alloy wiring 29 (this via 29 can be grasped as a copper alloy such as a Cu—Al alloy) are formed in the interlayer insulation film 26.

Here, the first barrier metal film 27 is a conduction film containing nitride and tantalum nitride may be used for it. In addition, when the first barrier metal film 27 is formed, the high-resistance part 60 is formed on the upper surface of the copper alloy wiring 22 that is in contact with the first barrier metal film 27. More specifically, the high-resistance part 60 is formed by the reaction between the additive element (Al) added to the copper alloy wiring 22 and nitrogen contained in the first barrier metal film 27.

In addition, the second barrier metal film 28 is a conduction film not containing nitrogen and tantalum may be used for it.

Then, a silicon carbonitride film 35 and the silicon oxide film 36 containing fluorine are formed on the interlayer insulation film 26 in this order so as to cover the copper alloy wiring 30 (FIG. 13). Then, a connection hole (not shown) and a trench pattern (not shown) are formed in the silicon carbonitride film 35 and the silicon oxide film 36 containing fluorine. Here, the connection hole and the trench pattern are formed by the dual damascene method that is a combination of the photolithography technique with dry etching process.

Then, following the procedures described above with reference to FIG. 9, the first barrier metal film 37, the second barrier metal film 38 and pure copper are formed. Then, the chemical mechanical polishing (CMP) process is performed on the pure copper and the first and second barrier metal films 37 and 38. Thus, as shown in FIG. 13, the copper wiring 40 and the copper via 39 are formed in the interlayer insulation film 36. Here, the copper wiring 40 and the copper via 39 do not comprise a copper alloy but comprise purer copper.

Here, the first barrier metal film 37 is a conduction film containing nitride and tantalum nitride may be used for it. In addition, when the first barrier metal film 37 is formed, a high-resistance part 60 is formed on the upper surface of the copper alloy wiring 30 that is in contact with the first barrier metal film 37. More specifically, the high-resistance part 60 is formed by the reaction between the additive element added to the copper alloy wiring 30 and nitrogen contained in the first barrier metal film 37.

In addition, the second barrier metal film 38 is a conduction film not containing nitrogen and tantalum may be used for it.

Then, a silicon carbonitride film 45 and a silicon oxide film 46 are formed on the interlayer insulation film 36 in this order so as to cover the copper wiring 40 (FIG. 13). Then, a connection hole (not shown) is formed in the silicon carbonitride film 45 and the silicon oxide film 46.

Then, aluminum is applied so that the connection hole is filled with it. Then, the aluminum formed on the silicon oxide film 46 is patterned into a predetermined pattern, whereby an aluminum pad 47 for taking out the electrode is formed (FIG. 13).

Then, a silicon nitride film 48 is formed as a protection film so as to cover the aluminum pad 47 (FIG. 13). Here, the silicon nitride film 48 has a predetermined opening 49 and the aluminum pad 47 is exposed from the bottom of the opening 49 (FIG. 13).

A plurality of semiconductor devices shown in FIG. 13 (that is, the semiconductor device comprising the constitution shown in FIG. 1) are formed according to the above manufacturing method so as to vary its constitution as follows. That is, the concentration of the additive element of the copper alloy wiring was varied from 0 to 0.01 wt %. In addition, the via diameter of the via was varied from 100 to 140 nm. Furthermore, the plurality of semiconductor devices having the constitution shown in FIG. 13, in which the concentration of the additive element and the via diameter are varied are simply referred to as a sample hereinafter.

Thus, the electric characteristics between the lower copper alloy wiring and the via, and EM resistance of the copper alloy wiring in each semiconductor device (that is, the EM resistance characteristics of the copper alloy wiring 3 and the electric resistance characteristics between the copper alloy wiring 3 and the via 4) were measured.

Figure 14:
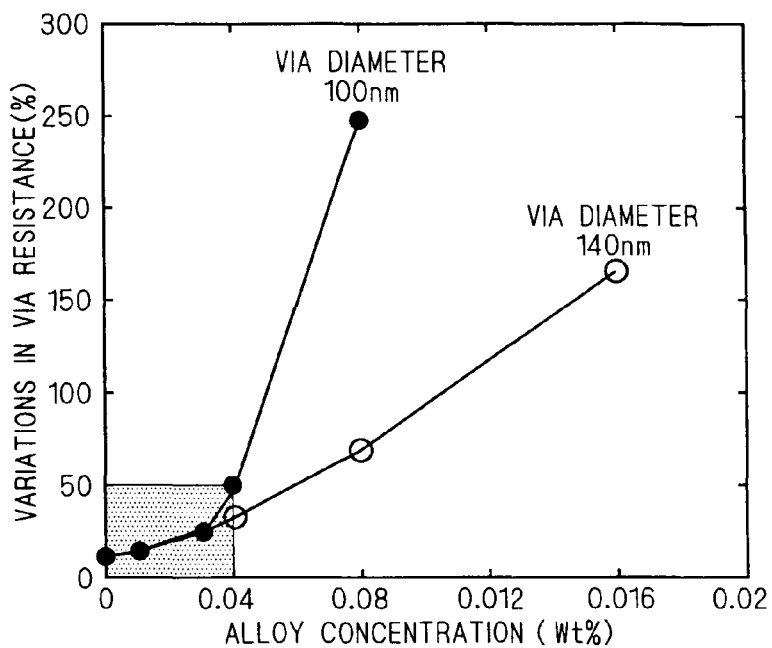
FIG. 14 is a view showing an experiment result in which the concentration of an additive element and variations in resistance are measured.

FIG. 14 shows one example of the above measured result (ICP measurement result), in which the relation between the concentration of the additive element (Al) contained in the copper alloy wiring 3 and variations in electric resistance between the copper alloy wiring 3 and the via 4 are shown. Here, the vertical axis shows the variations (%) in electric resistance between the copper alloy wiring 3 and the via 4, and the lateral axis shows the concentration (wt %) of the additive element (Al) contained in the copper alloy wiring 3 in FIG. 14.

In addition, the concentration of the additive element is the concentration of the center of the wiring measured with the SIMS analysis. In addition, the concentration of the additive element is shown in terms of wt %. The variations in electric resistance between the copper alloy wiring 3 and the via 4 is found by (maximum value-minimum value)/(twice the median value) from the measured value. Here, the "maximum value" means the maximum value among the measured result of the measured plurality of objects formed on a wafer in the same condition. The "minimum value" means the minimum value among the measured result of the plurality of objects.

In addition, the concentration of the additive element is measured by the ICP emission spectrometry as well as the SIMS measurement. The ICP emission spectrometry shows the average additive element concentration of the copper alloy wiring 3 hereinafter.

As can be found from the above example shown in FIG. 14 (ICP measurement result), the higher the concentration of the additive element (Al) in copper alloy wiring 3 is, the larger the variations in the electric resistance between the copper alloy wiring 3 and the via 4 is. Although it is not shown in FIG. 14, the experiment has found that the electric resistance between the copper alloy wiring 3 and the via 4 abnormally rises as the concentration of the additive element (Al) in copper alloy wiring 3 becomes high.

The electric resistance and the variations in the electric resistance rise because the high-resistance part 60 containing aluminum nitride is formed between the copper alloy wiring 3 and the via 4.

Furthermore, the experiment has found that when the concentration of the additive element is not more than 0.04 wt % (ICP emission spectrometry), the variations in electric resistance between the copper alloy wiring 3 and the via 4 is 50% or less which is allowable in design. That is, when the concentration of the additive element is not more than 0.04 wt % (ICP emission spectrometry), the high-resistance part 60 can be prevented from being formed.

Therefore, the variations in electric resistance between the copper alloy wiring 3 and the via 4 can be prevented. In addition, since the high-resistance part 60 can be prevented from being formed, the electric resistance between the via 4 and the copper alloy wiring 3 can be prevented from rising.

Furthermore, the experiment has found that the above effect can be provided when the concentration of the additive element is not more than 0.04 wt % (ICP emission spectrometry) without depending on the via diameter of the via 4 (more specifically, depending on it to some extent).

Still furthermore, it has been found that when the concentration of the additive element is not more than 0.03 wt % (ICP emission spectrometry), the variations in electric resistance between the copper alloy wiring 3 and the via 4 is more preferably 30% or less without depending on the via diameter of the via 4 (more specifically, depending on it to some extent).

Still furthermore, the experiment has found that when the concentration of the additive element contained in the copper alloy wiring 3 is not less than 0.01 wt % (ICP emission spectrometry), high EM resistance is provided.

In addition, it has been found that when the concentration of the additive element is less than 0.01 wt % (ICP emission spectrometry), the EM lifetime of the copper alloy wiring 3 is almost the same as the EM lifetime of a copper wiring comprising pure copper.

For example, as a result of the EM test for the sample in which the via diameter of the via 4 is 100 nm, it has been found that when the concentration of the additive element contained in the copper alloy wiring 3 is 0.01 wt % (ICP emission spectrometry), the EM lifetime of the copper alloy wiring 3 is more than twice as long as the EM lifetime of the copper wiring comprising pure copper.

Furthermore, for example, as a result of the EM test for the sample in which the via diameter of the via 4 is 100 nm, it has been found that when the concentration of the additive element contained in the copper alloy wiring 3 is 0.04 wt % (ICP emission spectrometry), the EM lifetime of the copper alloy wiring 3 is more than ten times as long as the EM lifetime of the copper wiring comprising pure copper.

Furthermore, for example, as a result of the EM test for the sample in which the via diameter of the via 4 is 100 nm, it has been found that when the concentration of the additive element contained in the copper alloy wiring 3 is 0.05 wt % (ICP emission spectrometry), the EM lifetime of the copper alloy wiring 3 is almost the same as the EM lifetime of the copper wiring comprising pure copper.

In addition, although it is disclosed that the EM resistance of the copper alloy wiring is superior to that of the pure copper wiring in the above documents, the minimum required concentration of the additive element is not referred.

In addition, although the additive element is Al in the above embodiment, the same effect (rise in the electric resistance and the variations in the electric resistance are prevented and the EM resistance is improved) can be provided when the additive element is Si, Ge, Ga, Sn and the like. However, in view of the resistance of the copper alloy wiring 3 itself, Al is the most ideal because the resistance value is low.

In addition, although TaN is used as the first barrier metal film 5 in the above embodiment, the same effect (the rise in the electric resistance and the variations in the electric resistance are prevented and the EM resistance is improved) can be provided when the barrier metal film 5 is TaSiN, TiN, WN and the like. However, in view of the barrier property to prevent diffusion of copper and the like, TaN and TaSiN are the most ideal.

In addition, as shown in FIG. 13, for example, the copper alloy wiring 22 (grasped as the second copper alloy wiring) provided upper (in the interlayer insulation film 2) than the copper alloy wiring 3 (grasped as the first copper alloy wiring) and electrically connected to the upper surface of the via 4 is further provided, and the copper alloy wiring 3 and the copper alloy wiring 22 and the via 4 comprise the same components.

When the above constitution is employed, even when an electron flows to the copper alloy wiring 22 from the copper alloy wiring 3 through the via 4, the EM resistance in the copper alloy wiring 22 can be improved.

In addition, the concentration of nitrogen contained in the first barrier metal films 5 and 7 is not less than 10 atomic %. Therefore, the barrier properties of the first barrier metal films 5 and 7 can be maintained. Furthermore, the concentration of nitride contained in the first barrier metal films 5 and 7 is not more than 40 atomic %. Therefore, the first barrier metal films 5 and 7 can be prevented from becoming highly resistive.

Furthermore, the thickness of the first barrier metal films 5 and 7 (especially the thickness of the first barrier metal films 5 and 7 on the sides of the copper alloy wiring 3 and the via 4) is not less than 1 nm. Therefore, the barrier properties of the first barrier metal films 5 and 7 can be maintained. In addition, the thickness of the first barrier metal films 5 and 7 (especially the thickness of the first barrier metal films 5 and 7 on the sides of the copper alloy wiring 3 and the via 4) is not more than 10 nm. Thus, the resistance values of the copper alloy wiring 3 and the via 4 can be prevented from rising due to reduction in copper alloy volumes in the copper alloy wiring 3 and the via 4.

Embodiment 2

The inventors examined the relation between the film thickness of the copper alloy wiring and the EM resistance using each sample described in the above embodiment 1. As a result, in copper alloy wiring, it has been found that the smaller the film thickness is, the higher a current density is, so that it is desirable that EM resistance is improved by increasing the concentration of the additive element in view of the EM lifetime as will be described below.

Thus, the EM resistance (EM lifetime) in the constitution of the copper alloy wiring 3 and the via 4 and the EM resistance (EM lifetime) in the constitution of the copper alloy wiring 22 and the via 29 in each sample (as described above in the embodiment 1, each of the semiconductor devices having the constitution shown in FIG. 13 in which the additive element concentration and the via diameter are varied) were examined and compared.

Here, both via diameters of the vias 4 and 29 are 100 nm. In addition, the film thickness of the copper alloy wiring 3 is 60% of the film thickness of the copper alloy wiring 22 (that is, the film thickness of the copper alloy wiring 3 is smaller than that of the copper alloy wiring 22). In addition, the concentration of the additive element in the copper alloy wiring 3 is 0.03 wt % or 0.04 wt % in the ICP measurement. The concentration of the additive element in the copper alloy wirings 22 and 30 is 0.02 wt % (ICP measurement).

As a result, it has been found that when the concentration of the additive element in the copper alloy wiring 3 is 0.03 wt %, the EM lifetime in the constitution of the copper alloy wiring 3 and the via 4 is 0.5 time as long as that in the constitution of the copper alloy wiring 22 and the via 29.

When the concentration of the additive element in the copper alloy wiring 3 is 0.04 wt %, the EM lifetime in the constitution of the copper alloy wiring 3 and the via 4 is about the same as that in the constitution of the copper alloy wiring 22 and the via 29.

As described above, the smaller the film thickness of the copper alloy wiring is, the shorter the EM lifetime is, so that it is necessary to increase the concentration of the additive element in the copper alloy wiring, in order to compensate for it. In addition, the reason why the EM lifetime becomes short as the film thickness of the copper alloy wiring is thinned at the same additive element concentration is that even in the case where the same volume void is formed in the connection part between the copper alloy wiring and the via, when the copper alloy wiring is thin, the connection part is likely to be cut.

Furthermore, in view of the reduction in the resistance value as will be described below, as can be understood from the above constitution (focusing on FIG. 13, for example), it is preferable that the copper alloy wiring 3 (grasped as the first copper alloy wiring) and the copper alloy wiring 22 (grasped as the second copper alloy wiring. Here, the film thickness of the second copper alloy wiring is larger than that of the first copper alloy wiring) satisfy the following relation.

That is, the concentration of the additive element of the copper alloy wiring 22 is preferably lower than that of the additive element of the copper alloy wiring 3. According to the regulation of the additive element, the rise in the resistance value of the copper alloy wiring 22 having the thick film can be prevented in accordance with the regulation. In addition, the copper alloy wiring 22 more preferably comprises not alloy but pure copper.

Embodiment 3

Figure 15:
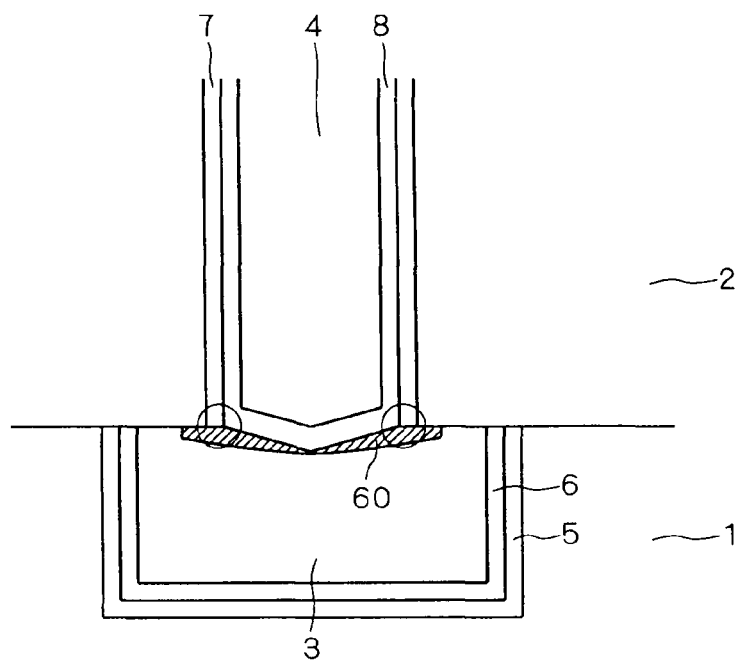
FIG. 15 is an enlarged sectional view showing a substantial constitution of a semiconductor device according to an embodiment 3.

FIG. 15 is an enlarged sectional view showing the constitution of a semiconductor device according to this embodiment. As can be clear from the comparison between FIG. 1 and FIG. 15, the semiconductor device in this embodiment and the semiconductor device according to the embodiment 1 are the same except for the following points.

That is, as shown in FIG. 15, in the semiconductor device according to this embodiment, the first barrier metal film 7 is removed at the connection part between a copper alloy wiring 3 and a via 4. Therefore, the via 4 is electrically connected to the copper alloy wiring 3 through a second barrier metal film 8 only in the connection part.

Here, the first barrier metal film 7 is a conduction film containing nitrogen as described in the embodiment 1. In addition, the second barrier metal film 8 is a conduction film not containing nitrogen.

As can be clear from manufacturing steps as will be described below, in the semiconductor device according to this embodiment also, a high-resistance part 60 is formed in the copper alloy wiring 3 in the vicinity of the connection part.

In addition, as can be clear from the manufacturing step as will be described below, the copper alloy wiring 3 in the vicinity of the connection part can be partially recessed.

In addition, as can be found from FIG. 15, the first barrier metal film 7 is formed between a interlayer insulation film 2 and the via 4. Therefore, focusing on the circle marks in FIG. 15, the end of the first barrier metal film 7 is connected to the upper surface of the copper alloy wiring 3.

The constitution except for the above is the same as that of the semiconductor device according to the embodiment 1. Therefore, the description thereof will be omitted.

A description will be made of the manufacturing method of the semiconductor device having the constitution shown in FIG. 15 (that is, the first barrier metal film 7 is not formed in the connection part between the copper alloy wiring 3 and the via 4, and the upper surface of the copper alloy wiring 3 is connected to the end of the first barrier metal film 7 formed on the side of the via 4, and only the second barrier metal film 8 is formed in the connection part).

First, the steps described in the embodiment 1 with reference to FIGS. 1 to 8 are performed.

Figure 16:
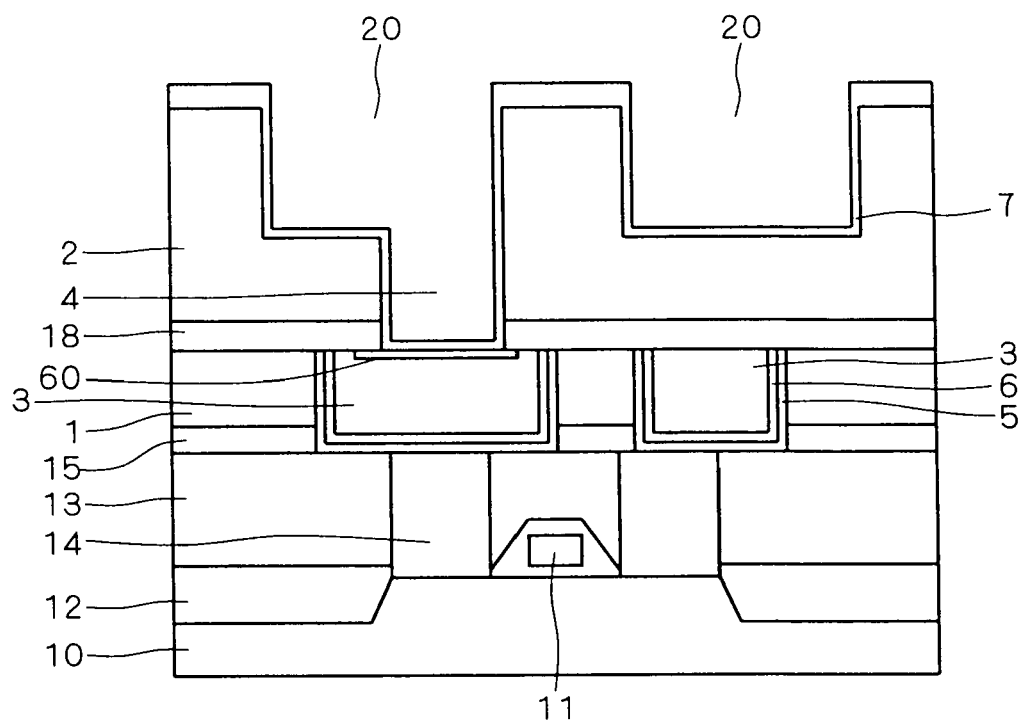
FIG. 16 is an explanatory sectional view showing a manufacturing step of the semiconductor device according to the embodiment 3.

Then, the first barrier metal film 7 is formed on the bottom and side of a trench pattern 20, the bottom and side of a connection hole 19, and on the interlayer insulation film 2 (FIG. 16).

Here, the first barrier metal film 7 is the conduction film containing nitride and tantalum nitride may be used for it. In addition, when the first barrier metal film 7 is formed, the high-resistance part 60 is formed on the upper surface of the copper alloy wiring 3 that is in contact with the first barrier metal film 7. More specifically, the high-resistance part 60 is formed by the reaction between an additive element (Al) added to the copper alloy wiring 3 and nitrogen contained in the first barrier metal film 7.

Then, a sputter etching process is performed using argon ion ($Ar^+$) in a chamber in which the first barrier metal film 7 was formed.

Figure 17:
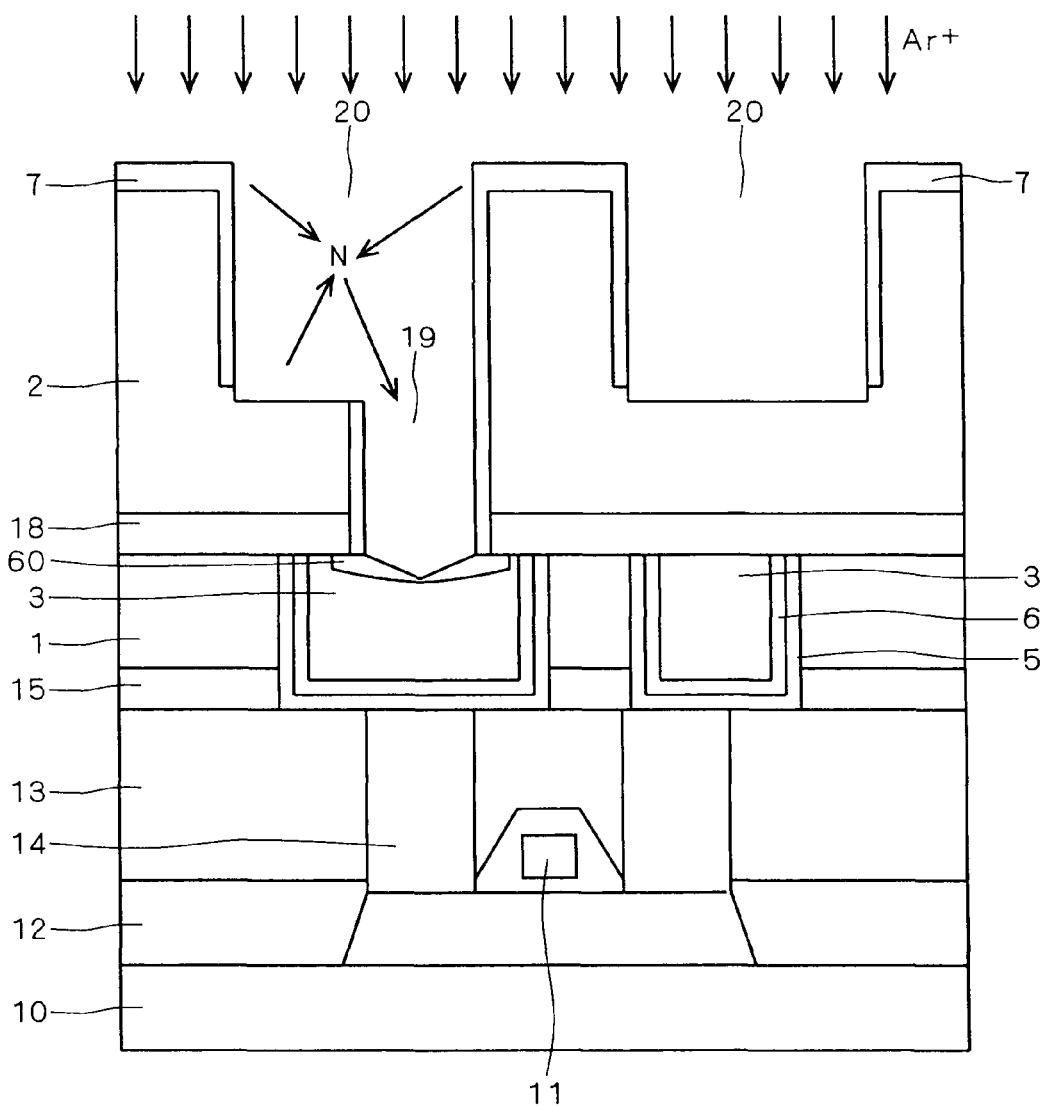
FIG. 17 is an explanatory sectional view showing a manufacturing step of the semiconductor device according to the embodiment 3.

Thus, as shown in FIG. 17, the first barrier metal film 7 on the interlayer insulation film 2, on the bottom of the trench pattern 20, and on the bottom of the connection hole 19 is removed. In addition, the first barrier metal film 7 formed on the interlayer insulation film 2 that is the outermost surface in the step shown in FIG. 16 has a film thicker than that formed in the trench pattern 16 and the like in general. Therefore, the first barrier metal film 7 could be left a little on the interlayer insulation film 2.

Thus, the first barrier metal film 7 is left on the side of the trench pattern 20 and on the side of the connection hole 19 only (FIG. 17). In addition, as described above, the first barrier metal film 7 could be left also on the interlayer insulation film 2.

In FIG. 17, focusing on the upper surface of the copper alloy wiring 3 existing below the connection hole 19, the upper surface of the copper alloy wiring 3 is connected to the end of the first barrier metal film 7 formed on the side of the connection hole 19. The upper surface of the copper alloy wiring 3 on which the high-resistance part 60 is formed other than that connected part is exposed from the bottom of the connection hole 19.

As shown in FIG. 17, a part of the upper surface of the copper alloy wiring 3 existing below the connection hole 19 and a part of the interlayer insulation film 2 existing below the trench pattern 20 could be etched away by the sputter etching process in some cases.

When the first barrier metal film 7 is removed by the sputter etching process, nitrogen is introduced into a chamber. Thus, the formation of the high-resistance part 60 is progressed a little at the upper surface part of the copper alloy wiring 3 exposed from the bottom of the connection hole 19 by the influence of the emitted nitrogen.

After a part of the first barrier metal film 7 has been removed, the second barrier metal film 8 is formed on the side and bottom of the trench pattern 20 and the side and bottom of the connection hole 19 and on the interlayer insulation film 2.

Figure 18:
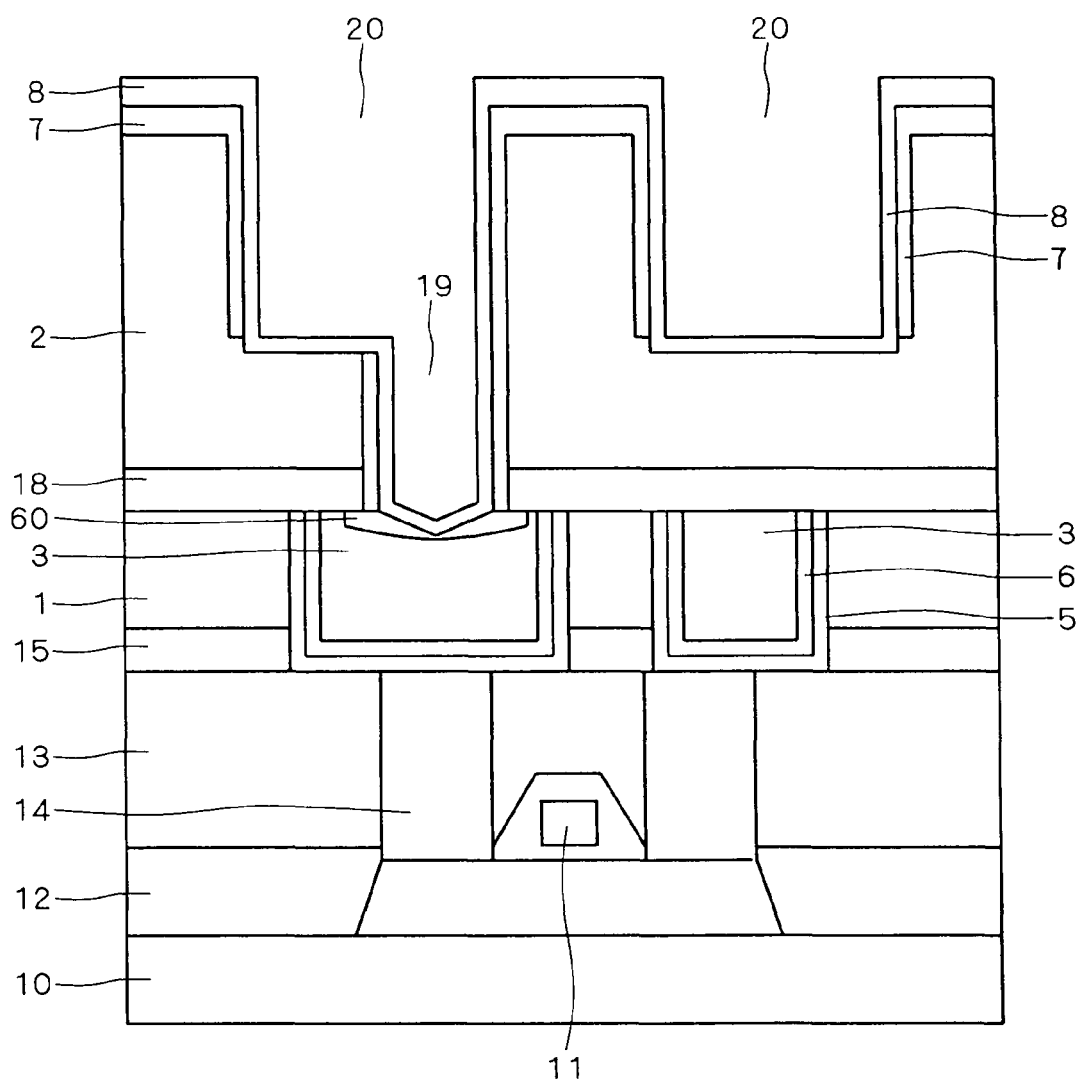
FIG. 18 is an explanatory sectional view showing a manufacturing step of the semiconductor device according to the embodiment 3.

Therefore, as can be found from FIG. 18, only the second barrier metal film 8 is formed on the bottom of the trench pattern 20 and the bottom of the connection hole 19. Meanwhile, the first barrier metal film 7 and the second barrier metal film 8 are formed on the upper surface of the interlayer insulation film 2, the side of the trench pattern 20, and the side of the connection hole 19 (the first barrier metal film 7 is formed so as to be in contact with the interlayer insulation film 2 and the second barrier metal film 8 is formed on the first barrier metal film 7).

Here, the second barrier metal film 8 is the conduction film not containing nitrogen and tantalum can be used for it.

Figure 19:
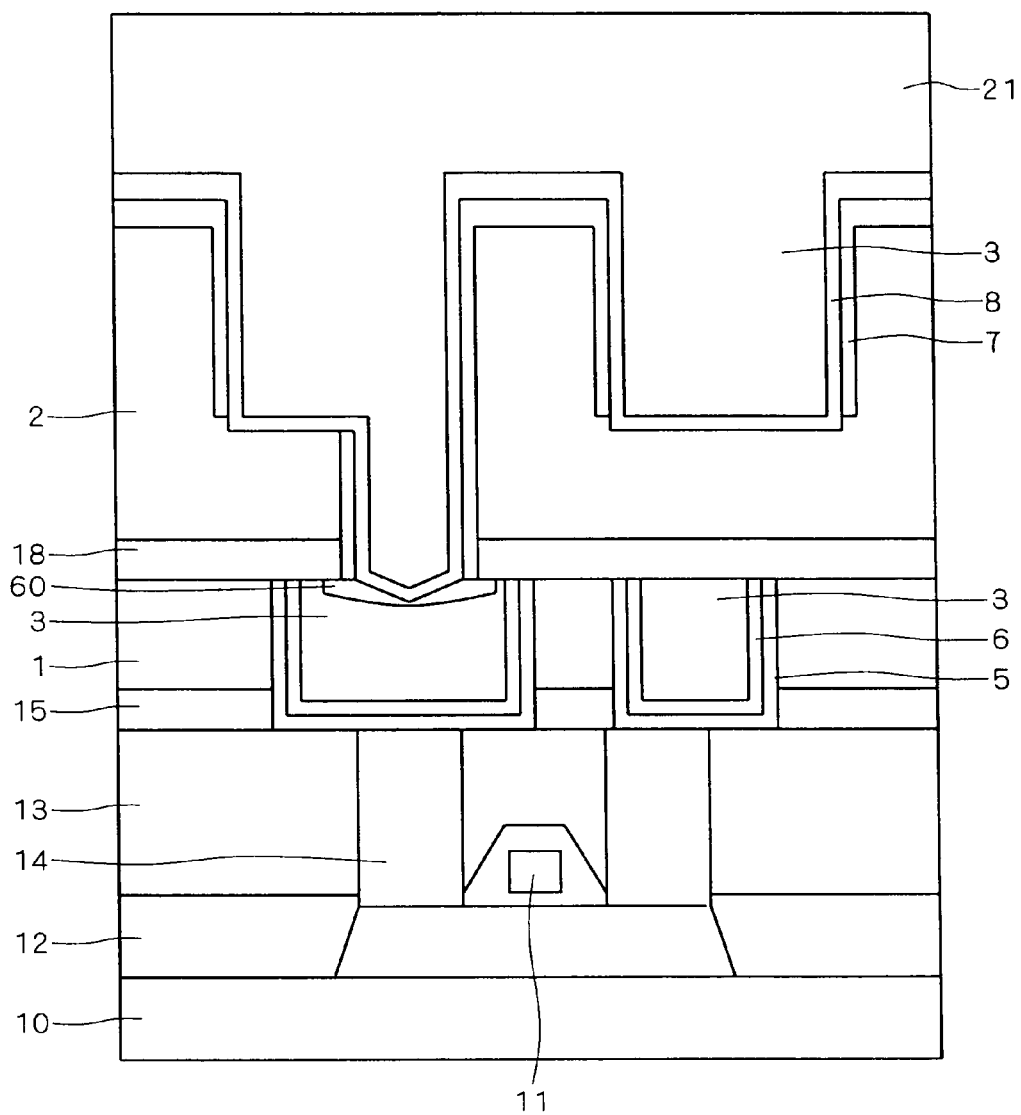
FIG. 19 is an explanatory sectional view showing a manufacturing step of the semiconductor device according to the embodiment 3.

Then, as shown in FIG. 19, a copper alloy 21 is formed on the second barrier metal film 8 so that the connection hole 19 and the trench pattern 20 are filled with it. Here, the copper alloy 21 is a Cu—Al alloy containing Al as a predetermined additive element similar to the embodiment 1. In addition, the copper alloy 21 is formed by electrolytic plating and annealing processes after a predetermined seed film has been formed as described above in the embodiment 1.

Figure 20:
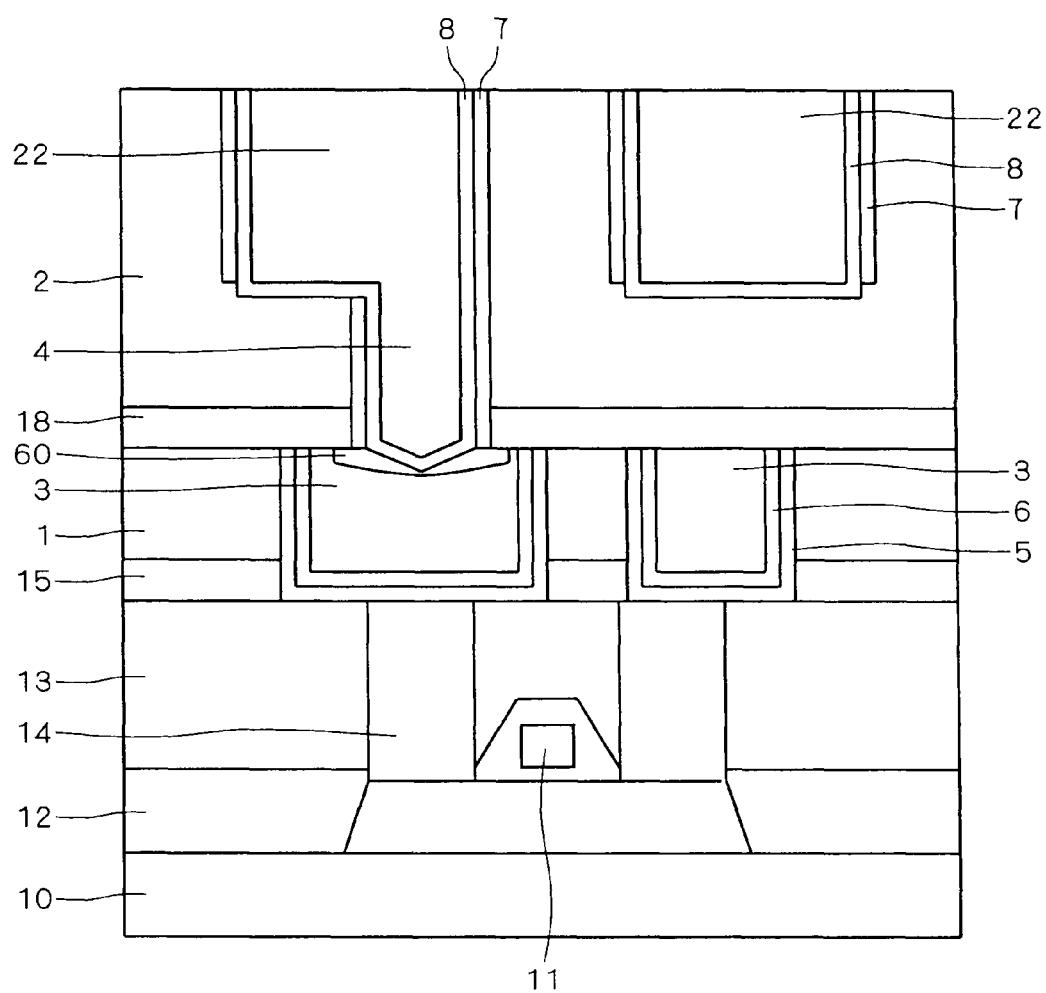
FIG. 20 is an explanatory sectional view showing a manufacturing step of the semiconductor device according to the embodiment 3.

After the Cu—Al alloy 21 has been formed, the chemical mechanical polishing (CMP) process is performed on the Cu—Al alloy 21 and the first and second barrier metal films 7 and 8. Thus, as shown in FIG. 20, the Cu—Al alloy 21, the second barrier metal film 8 and the first barrier metal film 7 outside the connection hole 19 and the trench pattern 20 (that is, on the interlayer insulation film 2) are removed and a copper alloy wiring 22 and a via 4 are formed in the interlayer insulation film 2. In addition, as can be known from the above steps, the via 4 comprises a copper alloy such as a Cu—Al alloy.

In addition, the steps from the next step to a step for forming an aluminum pad 47 and a silicon nitride film 48 serving as a protection film are the same as steps described with reference to FIGS. 12 and 13 (refer to the corresponding part in the embodiment 1). Therefore, the description of those steps will be omitted.

The inventors performed an experiment to compare the effect of the semiconductor device according to this embodiment with the effect of the semiconductor device according to the embodiment 1. The following samples were prepared for the experiment.

That is, the semiconductor device comprising the constitution shown in FIG. 13, in which the additive element concentration of the copper alloy wiring 3 is 0.04 wt % (ICP measurement) and the additive element concentration of the copper alloy wiring 22 is 0.03 wt % (ICP measurement) (that is, the semiconductor device according to the embodiment 1 and referred to as the sample A hereinafter), and the semiconductor device comprising the constitution shown in FIG. 20, in which the additive element concentration of the copper alloy wiring 3 is 0.04 wt % (ICP measurement) and the additive element concentration of the copper alloy wiring 22 is 0.03 wt % (ICP measurement) (that is, the semiconductor device according to this embodiment and referred to as the sample B hereinafter) were prepared.

As a result of the experiment, it has been found that while the variations in electric resistance in the connection part between the copper alloy wiring 3 and the via 4 is 50% in the sample A, the variations can be lowered to 40% in the sample B.

In addition, it has been found that the average electric resistance of the connection part between the copper alloy wiring 3 and the via 4 in the sample B is 60% of that of the sample A. This is because while the first barrier metal film 7 and the second barrier metal film 8 are formed in the connection part of the sample A, only the second barrier metal film 8 is formed in the sample B, that is, because the whole barrier metal film is thinner in the sample B.

As can be found from the above steps, in the semiconductor device according to this embodiment, the upper surface of the copper alloy wiring 3 and the first barrier metal film 7 have a chance to be in contact with each other. In addition, when the first barrier metal film 7 is removed, the upper surface of the copper alloy wiring 3 is exposed to the atmosphere containing nitrogen. Furthermore, a part of the first barrier metal film 7 is in contact with the upper surface of the copper alloy wiring 3 in a completed product although their contact area is small. However, in this embodiment also, the concentration of the additive element of the copper alloy wiring 3 is limited to the range shown in the embodiment 1.

Thus, the semiconductor device according to this embodiment also allows for reduction in the electric resistance in the connection part between the copper alloy wiring 3 and the via 4 and prevention of the variations in the electric resistance, similar to the embodiment 1.

Furthermore, as can be found from the experiment result described in this embodiment, by employing the semiconductor device according to this embodiment, the electric resistance in the connection part between the copper alloy wiring and the via can be more reduced and the variations of that electric resistance can be more prevented than the semiconductor device according to the embodiment 1.

In addition, according to the semiconductor device in the embodiment 1, the contact area between the upper surface of the copper alloy wiring 3 and the barrier metal film 7 is large. However, according to the semiconductor device in the embodiment 1, the manufacturing steps can be simplified because there is no step of removing the first barrier metal film 7 as compared with this embodiment.

Meanwhile, as described above, according to the semiconductor device in this embodiment, the number of manufacturing steps is increased a little as compared with the embodiment 1. However, the contact surface between the upper surface of the copper alloy wiring 3 and the first barrier metal film 7 can be small as compared with the case of the embodiment 1 (according to this embodiment, the end of the first barrier metal film 7 formed between the interlayer insulation film 2 and the side of the via 4 is only slightly in contact with the upper surface of the copper alloy wiring 3 as described above).

Thus, since the high-resistance part 60 can be prevented from being formed, the electric resistance in the connection part between the copper alloy wiring 3 and the via 4 can be reduced and the variations in that electric resistance can be more prevented.

In addition, in the constitution shown in FIG. 15, the via 4 comprising the copper alloy (Cu—Al alloy) is formed by the plating process (including a heat treatment after the plating process) after the seed film has been formed from the Cu—Al alloy. Therefore, the Al concentration at the peripheral part tends to be higher than that inside part of the via 4 in general.

When both first barrier metal film 7 and second barrier metal film 8 are not formed in the connection part between the copper alloy wiring 3 and the via 4 comprising the copper alloy (Cu—Al alloy), nitrogen contained in the first barrier metal film 7 is likely to react with Al contained in the vicinity of the peripheral part of the via 4. That is, the formation of the high-resistance part 60 is promoted.

However, according to this embodiment, as shown in FIG. 15, the first barrier metal film 7 is not formed in the connection part between the copper alloy wiring 3 and the via 4 comprising the copper alloy (Cu—Al alloy). In addition, the second barrier metal film 8 is formed in the connection part between the copper alloy wiring 3 and the via 4 (the constitution in which the first barrier metal film 7 is removed from the connection part is referred to as the punch-through structure hereinafter).

Therefore, the second barrier metal film 8 functions as a barrier and prevents the nitrogen contained in the first barrier metal film 7 from reacting with the Al contained in the vicinity of the peripheral part of the via 4. Thus, by employing the semiconductor device according to this embodiment, the high-resistance part 60 is further prevented from being formed in the connection part between the copper alloy wiring 3 and the via 4.

Figure 21:
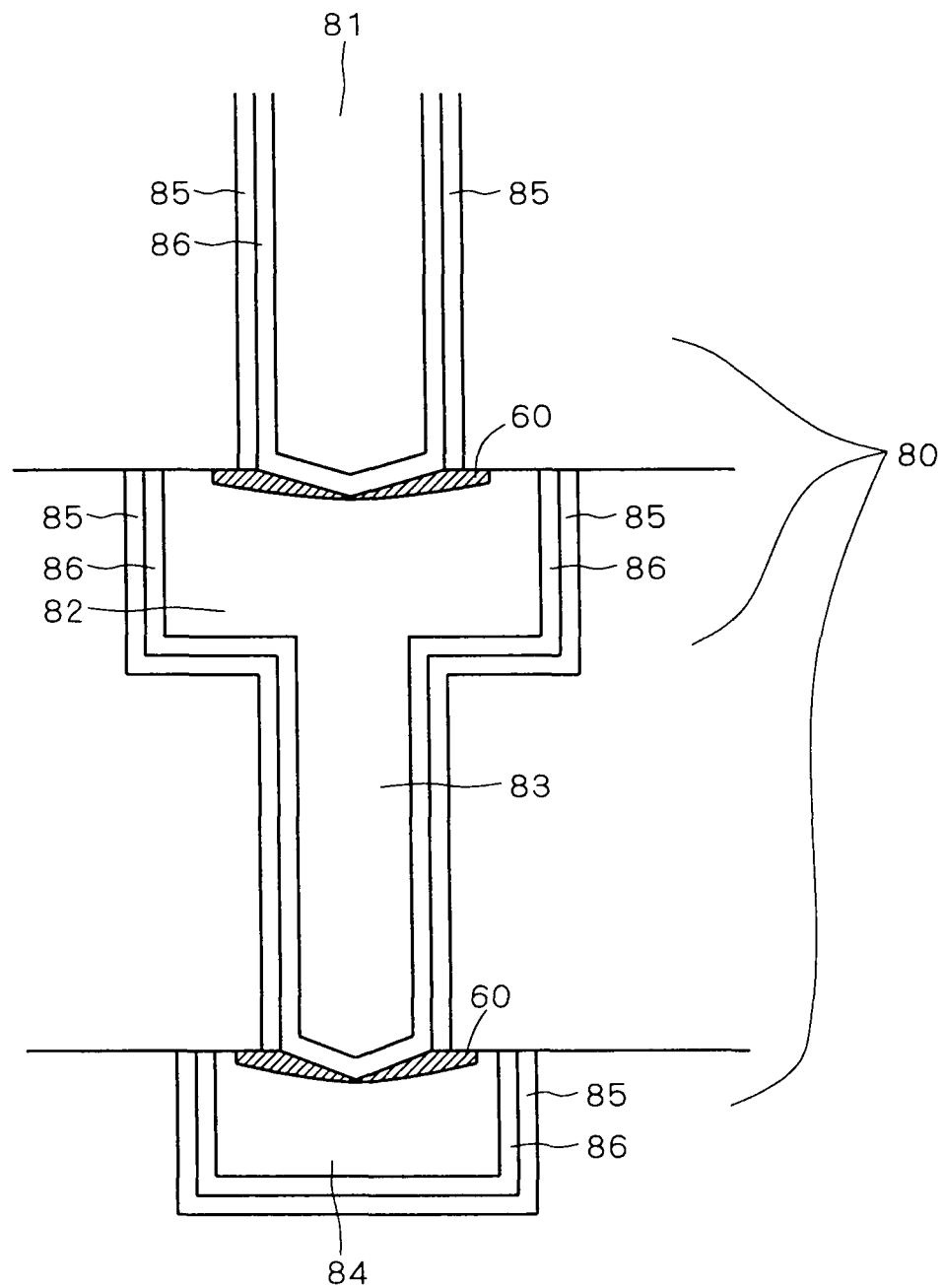
FIG. 21 is a sectional view showing that the constitution according to the embodiment 3 is sequentially provided over a lower to upper layers.

In addition, as shown in FIG. 21, the punch-through structure may be sequentially formed over an upper via and a lower via.

According to a structure shown in FIG. 21, a first via 81, a first copper alloy wiring 82, a second via 83 and a second copper alloy wiring 84 are formed in an interlayer insulation film 80.

Here, Al is added to copper (Cu) that is a main component in the first via 81, the first copper alloy wiring 82, the second via 83, and the second copper alloy wiring 84. In addition, the first copper alloy wiring 82 is electrically connected to the bottom of the first via 81. Furthermore, the second via 83 is electrically connected to the bottom of the first copper alloy wiring 82. Still furthermore, the second copper alloy wiring 84 is electrically connected to the bottom of the second via 83.

As shown in FIG. 21, a first barrier metal film 85 containing nitrogen is formed between the interlayer insulation film 80, and the sides of the first via 81 and the second via 83. The first barrier metal film 85 is also formed between the interlayer insulation film 80 and the first and second copper alloy wirings 82 and 84.

Here, the first barrier metal film 85 is in contact with the interlayer insulation film 80, and it is not formed in the connection part between the first copper alloy wiring 82 and the first via 81, and it is not formed in the connection part between the second copper alloy wiring 84 and the second via 83.

In addition, a second barrier metal film 86 not containing nitrogen is formed between the interlayer insulation film 80, and the sides of the first via 81 and the second via 83. In addition, the second barrier metal film 86 is formed between the interlayer insulation film 80 and the first and second copper alloy wirings 82 and 84.

Here, the second barrier metal film 86 is in contact with the first via 81 and the second via 83, it is formed in the connection part between the first copper alloy wiring 82 and the first via 81, and formed in the connection part between the second copper alloy wiring 84 and the second via 83.

When the punch-through structure is sequentially provided, the effect described in this embodiment can be provided as a matter of course.

Embodiment 4

Next, a description will be made of another manufacturing method of the semiconductor device comprising the structure shown in FIG. 15 (in which the first barrier metal film 7 is not formed in the connection part between the copper alloy wiring 3 and the via 4, the upper surface of the copper alloy wiring 3 is in contact with the end of the first barrier metal film 7 formed on the side of the via, and only the second barrier metal film 8 is formed in the connection part).

First, the steps described in the embodiment 1 with reference to FIGS. 1 to 8 are performed.

Next, the first barrier metal film 7 is formed on the bottom and side of the trench pattern 20, the bottom and the side of the connection hole 19, and on an interlayer insulation film 2 (FIG. 22).

Here, the first barrier metal film 7 is the conduction film containing nitride and tantalum nitride may be used for it. In addition, when the first barrier metal film 7 is formed, the high-resistance part 60 is formed on the upper surface of the copper alloy wiring 3 that is in contact with the first barrier metal film 7. More specifically, the high-resistance part 60 is formed by the reaction between the additive element (Al) added to the copper alloy wiring 3 and nitrogen contained in the first barrier metal film 7.

Then, the second barrier metal film 8 is formed on the first barrier metal film 7 (FIG. 22). Here the second barrier metal film 8 is the conduction film not containing nitrogen, and tantalum may be used for it.

Figure 23:
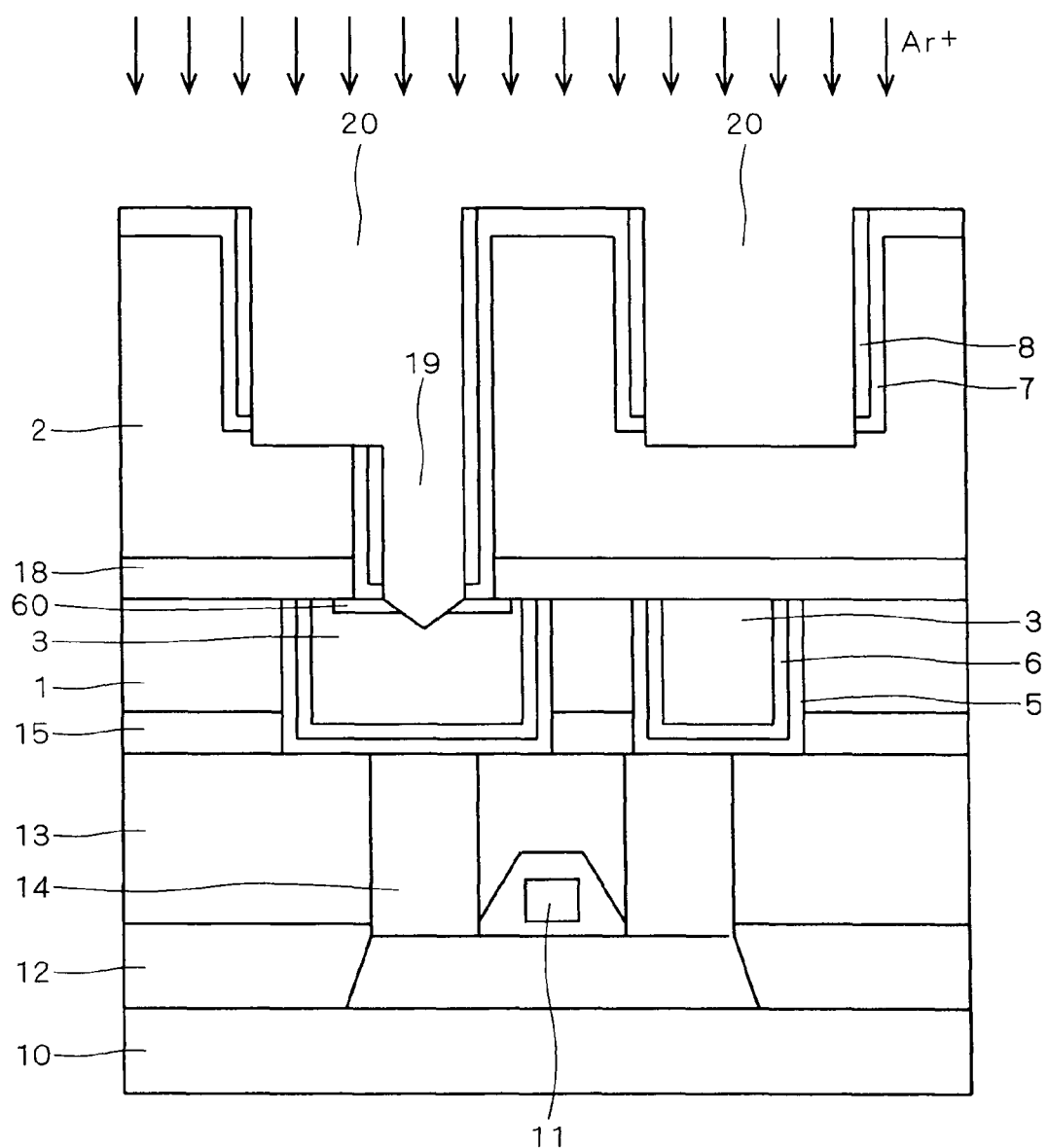
FIG. 23 is an explanatory sectional view showing a manufacturing step of the semiconductor device according to the embodiment 4.

Then, a sputter etching process is performed using argon ion (Ark) in a chamber in which the first barrier metal film 7 was formed (FIG. 23).

Thus, as shown in FIG. 23, the first and second barrier metal films 7 and 8 on the bottom of the trench pattern 20 and on the bottom of the connection hole 19 are removed. In addition, each of the first and second barrier metal films 7 and 8 formed on the interlayer insulation film 2 that is the outermost surface in the step shown in FIG. 22 has a film thickness larger than that formed in the trench pattern 20 and the connection hole 19 in general. Therefore, the first barrier metal film 7 could be left a little on the interlayer insulation film 2.

Thus, the first and second barrier metal films 7 and 8 are left on the side of the trench pattern 20 and on the side of the connection hole 19 only (FIG. 23). In addition, as described above, the first barrier metal film 7 could be left on the interlayer insulation film 2 also.

In FIG. 23, focusing on the upper surface of the copper alloy wiring 3, the upper surface of the copper alloy wiring 3 is connected to the end of the first barrier metal film 7 formed on the side of the connection hole 19. Moreover, a part of the upper surface of the copper alloy wiring 3 is exposed from the bottom of the connection hole 19.

As shown in FIG. 23, a part of the upper surface of the copper alloy wiring 3 existing below the connection hole 19 and a part of the interlayer insulation film 2 existing below the trench pattern 20 could be etched away by the sputter etching process.

In addition, when the sputter etching is performed, the first barrier metal film 7 is covered with the second barrier metal film 8. Thus, the amount of nitrogen introduced into the chamber can be prevented. Therefore, the high-resistance part 60 can be prevented from being formed at the part of the copper alloy wiring 3 exposing from the bottom of the connection hole 19.

Figure 24:
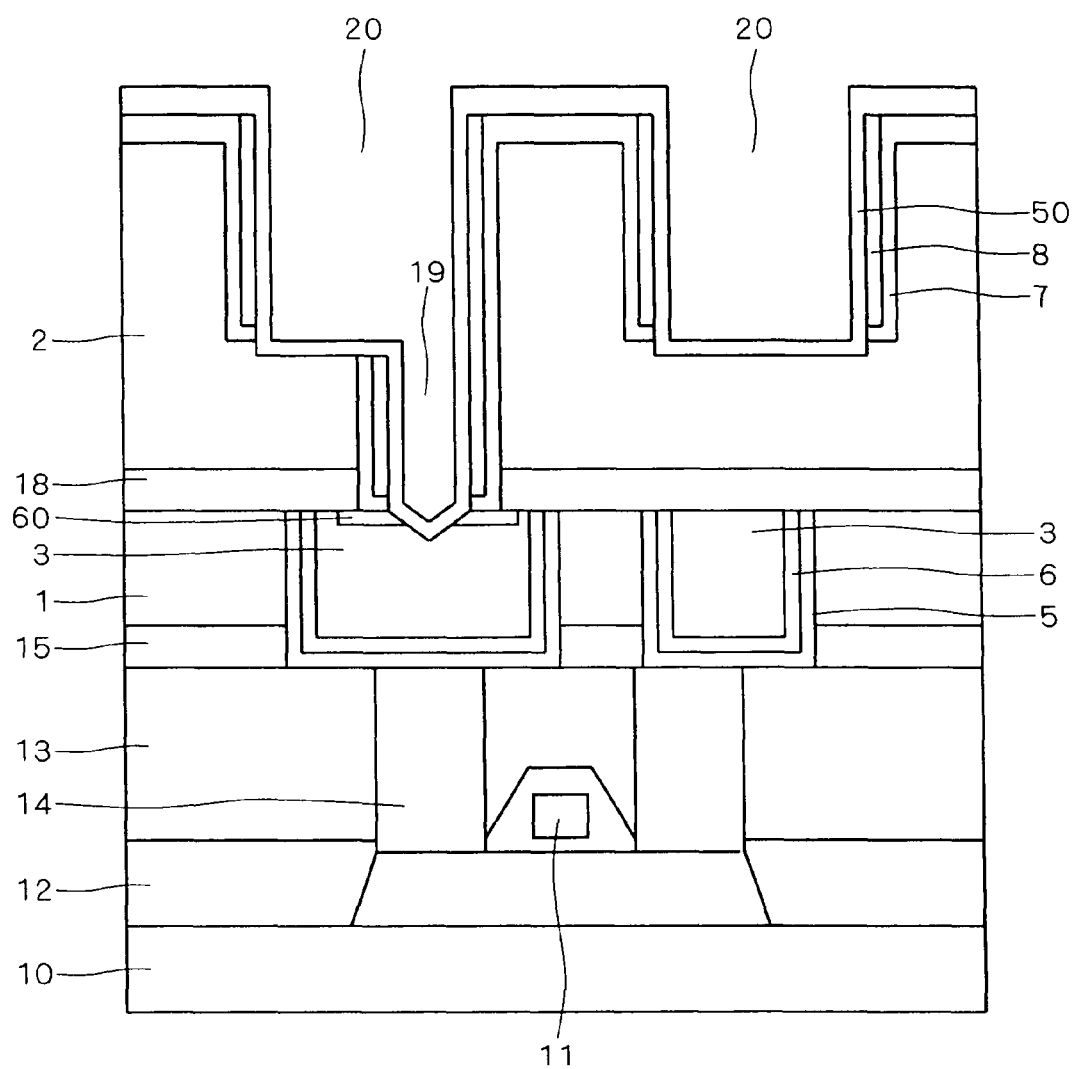
FIG. 24 is an explanatory sectional view showing a manufacturing step of the semiconductor device according to the embodiment 4.

Then, after the sputter etching as shown in FIG. 24, a third barrier metal film 50 is formed on the barrier metal films 7 and 8 and on the bottom of the connection hole 19. Here, the third barrier metal film 50 is the conduction film not containing nitrogen and tantalum may be used for it.

Then, as shown in FIG. 25, the copper alloy 21 is formed on the third barrier metal film 50 so that the connection hole 19 and the trench pattern 20 are filled with it. Here, the copper alloy 21 is a Cu—Al alloy containing Al as a predetermined additive element in the main component copper (Cu), for example. In addition, the copper alloy 21 is formed by electrolytic plating and annealing processes after a predetermined seed film has been formed.

After the copper alloy 21 has been formed, the chemical mechanical polishing (CMP) process is performed on the copper alloy 21 and the barrier metal films 7 and 50. Thus, as shown in FIG. 26, the copper alloy 21, the barrier metal films 7 and 50 outside the connection hole 19 and the trench pattern 20 (that is, on the interlayer insulation film 2) are removed and the copper alloy wiring 22 and the via 4 are formed in the interlayer insulation film 2. In addition, as can be known from the above steps, the via 4 comprises a copper alloy such as a Cu—Al alloy.

In addition, the steps from the next step to the step for forming the aluminum pad 47 and the silicon nitride film 48 serving as a protection film are the same as steps described with reference to FIGS. 12 and 13 (refer to the corresponding part in the embodiment 1). Therefore, the description of those steps will be omitted.

The inventors performed an experiment to compare the effect of the semiconductor device according to this embodiment with the effect of the semiconductor device according to the embodiment 1. The following samples were prepared for the experiment.

That is, the semiconductor device comprising the constitution shown in FIG. 13, in which the additive element concentration of the copper alloy wiring 3 is 0.04 wt % (ICP measurement) and the additive element concentration of the copper alloy wiring 22 is 0.03 wt % (ICP measurement) (that is, the semiconductor device according to the embodiment 1 and referred to as the sample A hereinafter), and the semiconductor device comprising the constitution shown in FIG. 26, for example in which the additive element concentration of the copper alloy wiring 3 is 0.04 wt % (ICP measurement) and the additive element concentration of the copper alloy wiring 22 is 0.03 wt % (ICP measurement) (that is, the semiconductor device according to this embodiment and referred to as the sample C hereinafter) were prepared.

As a result of the experiment, it has been found that while the variations in the electric resistance in the connection part between the copper alloy wiring 3 and the via 4 is 50% in the sample A, the variations can be lowered to 20% in the sample C.

The effect to prevent the variations in the electric resistance in the sample C is superior to that of the sample B. This is because, as described above, the first barrier metal film 7 is covered with the second barrier metal film 8 when the sputter etching is performed (FIG. 23). Thus, the amount of nitrogen introduced into the chamber can be prevented. Therefore, the high-resistance part 60 can be prevented from being formed in the part of the copper alloy wiring 3 exposing from the bottom of the connection hole 19.

In addition, the average electric resistance of the sample C in the connection part between the copper alloy wiring 3 and the via 4 in the sample C is 60% of that of the sample A. This is because while the first barrier metal film 7 and the second barrier metal film 8 are formed in the sample A, only the second barrier metal film 50 is formed in the sample C, that is, because the whole barrier metal film is thinner in the sample C.

As described above, by employing the semiconductor device according to this embodiment, the electric resistance in the connection part between the copper alloy wiring and the via can be reduced more and the variations of the electric resistance can be prevented more than the semiconductor device according to the embodiment 1.

Furthermore, the third barrier metal film 50 is formed in the semiconductor device according to this embodiment. Therefore, copper and the like can be prevented from being diffused from the bottom of the copper alloy wiring 22 to the interlayer insulation film 2.

As can be found from the above steps, in the semiconductor device according to this embodiment, the upper surface of the copper alloy wiring 3 and the first barrier metal film 7 have a chance to be in contact with each other. Furthermore, a part of the first barrier metal film 7 (i.e. an edge part of the barrier metal film 7 formed between the interlayer insulation film 2 and a side of the via 4) is in contact with the upper surface of the copper alloy wiring 3 in a completed product although their contact area is small. However, in this embodiment also, the concentration of the additive element of the copper alloy wiring 3 is limited to the range shown in the embodiment 1.

Thus, the semiconductor device according to this embodiment also allows for reduction in electric resistance in the connection part between the copper alloy wiring 3 and the via 4 and prevention of the variations in the electric resistance, similar to the embodiment 1.

Furthermore, as can be found from the experiment result described in this embodiment, by employing the semiconductor device according to this embodiment, the electric resistance in the connection part between the copper alloy wiring and the via can be more reduced and the variations of that electric resistance can be more prevented than the semiconductor device according to the embodiment 1.

In addition, according to the semiconductor device in the embodiment 3, the number of manufacturing steps is reduced because there is no step of forming the third barrier metal film 50 as compared with this embodiment. However, when the first barrier metal film 7 is removed, the upper surface of the copper alloy wiring 3 is exposed to the atmosphere containing nitrogen and the high-resistance part 60 may be easily formed.

Meanwhile, as described above, according to the semiconductor device in this embodiment, the number of manufacturing steps is increased a little as compared with the embodiment 1. However, as described above, the amount of nitrogen introduced into the chamber can be prevented at the time of the sputter etching (FIG. 23).

Therefore, the high-resistance part 60 can be prevented from being formed in the copper alloy wiring 3 exposed from the bottom of the connection hole 19. Thus, the electric resistance in the connection part between the copper alloy wiring 3 and the via 4 can be reduced and the variations in that electric resistance can be more prevented.

In addition, in this embodiment also, the first barrier metal film 7 is not formed in the connection part between the copper alloy wiring 3 and the via 4 comprising the copper alloy (Cu—Al alloy). In addition, the second barrier metal film 8 is formed in the connection part between the copper alloy wiring 3 and the via 4 (the constitution in which the first barrier metal film 7 is removed from the connection part is referred to as the punch-through structure hereinafter).

Therefore, the second barrier metal film 8 functions as a barrier and prevents the nitrogen contained in the first barrier metal film 7 from reacting with the Al contained in the vicinity of the peripheral part of the via 4. Thus, by employing the semiconductor device according to this embodiment, the high-resistance part 60 is further prevented from being formed in the connection part between the copper alloy wiring 3 and the via 4.

In addition, as described in the embodiment 3, the punch-through structure may be sequentially formed over an upper via and a lower via (FIG. 27).

According to a structure shown in FIG. 27, a first via 81, a first copper alloy wiring 82, a second via 83 and a second copper alloy wiring 84 are formed in an interlayer insulation film 80.

Here, Al is added to copper (Cu) that is a main component in the first via 81, the first copper alloy wiring 82, the second via 83, and the second copper alloy wiring 84. In addition, the first copper alloy wiring 82 is electrically connected to the bottom of the first via 81. Furthermore, the second via 83 is electrically connected to the bottom of the first copper alloy wiring 82. Still furthermore, the second copper alloy wiring 84 is electrically connected to the bottom of the second via 83.

As shown in FIG. 27, a first barrier metal film 85, a second barrier metal film 86 and a third barrier metal film 50 are laminated in this order from the interlayer insulation film 80 into the via, on the sides of the first via 81 and the second via 83. Here, the first barrier metal film 85 contains nitrogen. The second barrier metal film 86 and the third barrier metal film 50 do not contain nitrogen.

Furthermore, as shown in FIG. 27, a first barrier metal film 85, a second barrier metal film 87 and a third barrier metal film 50 are laminated in this order from the interlayer insulation film 80 into the wiring, on the side of the first copper alloy wiring 82. In addition, only the third barrier metal film 50 is formed on the bottom of the first copper alloy wiring 82.

Still furthermore, as shown in FIG. 27, only the third barrier metal film 50 is formed in the connection part between the first via 81 and the copper alloy wiring 82. In addition, only the third barrier metal film 60 is formed in the connection part between the second via 83 and the second copper alloy wiring 84. That is, the first barrier metal film 85 containing nitrogen is not formed in the connection part between each of the vias 81 and 83 and each of the copper alloy wirings 82 and 84.

Even when the punch-through structure is sequentially provided, the effect described in this embodiment can be provided as a matter of course.

In addition, in the semiconductor device according to the present invention (focusing on FIG. 13, for example), the interlayer insulation films 1, 2, 26 and 36 may be SiOC films or films having different dielectric constants such as FSG (SiOF) films. When the above films are used as the interlayer insulation films 1, 2, 26 and 36, parasitic capacity can be reduced. In addition, the SiOC film can reduce the parasitic capacity more than the FSG film.

In addition, in the semiconductor device according to the present invention (focusing on FIG. 13, for example), the first dual damascene structure and the second dual damascene structure are contained.

Here, the first dual damascene structure is provided in the interlayer insulation film 26 and comprises the copper alloy wiring 30 (grasped as the first wiring) having the film thickness smaller than that of the copper alloy wiring 40 and the via 29 (grasped as a first via) comprising the copper alloy. In addition, in the first dual damascene structure, the bottom of the copper via 39 is connected to the upper surface of the copper alloy wiring 30. Here, in the first dual damascene structure, Al is added to the main component (Cu) as an additive element.

Meanwhile, the second dual damascene structure is provided in the interlayer insulation film 36 and comprises the copper alloy wiring 40 (grasped as the second wiring) having the film thickness larger than that of the copper alloy wiring 30 and the copper via 39 (grasped as the second via), so that it comprises pure copper.

When the first dual damascene structure and the second dual damascene structure are provided, the semiconductor device having the above structures can reduce the resistance value in the second dual damascene structure more than that in the first dual damascene structure. Thus, the copper wiring 40 existing in the upper layer and having the thick film thickness can be arranged over a distance longer than the copper alloy wiring 30 existing in the lower layer.

Furthermore, in the first and second dual damascene structure, the diameter of the copper via 39 existing in the upper layer is made larger then that of the via 29 existing in the lower layer. Thus, the resistance of the second dual damascene can be smaller than that of the first dual damascene structure.

In addition, in the first and second dual damascene structures, the first barrier metal film 37 containing at least nitrogen is formed in the connection part between the bottom of the copper via 39 and the upper surface of the copper alloy wiring 30 as shown in FIG. 13, for example. Thus, the high-resistance part 60 is formed on the upper surface of the copper alloy wiring 30 in the connection part.

However, since the concentration of Al contained in the copper alloy wiring 39 is not more than 0.04 wt % (ICP emission spectrum), the high-resistance part 60 can be prevented from being formed. Furthermore, since the concentration of Al contained in the copper alloy wiring 39 is not less than 0.01 wt % (ICP emission spectrum), the EM resistance in the copper alloy wiring 39 can be improved.

Furthermore, in the above first and second dual damascene structures (focusing on FIG. 13, for example), the first barrier metal film 37 containing nitrogen is formed between the second dual damascene structure and the interlayer insulation film 36 so as to be in contact with the interlayer insulation film 36. In addition, the second barrier metal film 38 not containing nitrogen is formed between the second dual damascene structure and the interlayer insulation film 36 so as to be in contact with the copper wiring 40 and the copper via 39.

According to the above structure, the first barrier metal film 37 containing nitrogen is highly adherent to the interlayer insulation film 36 more than the second barrier metal film 38 and the second barrier metal film 38 not containing nitrogen is highly adherent to copper (Cu) more than the first barrier metal film 37.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
  a first copper alloy wiring formed in an interlayer insulation film and containing a predetermined additive element in a main component Cu;
  a via formed in said interlayer insulation film and electrically connected to the upper surface of said first copper alloy wiring;
  a first barrier metal film formed between said first copper alloy wiring and said via, and being in contact with said first copper alloy wiring, and containing nitrogen, and
  a second barrier metal film being in contact with said via, between said interlayer insulation film and said via, wherein
  each of the first and second barrier metals is formed at a connection portion of the bottom of the via,
  the concentration of said predetermined additive element is not more than 0.04 wt %, and
  the concentration of said predetermined additive element is not less than 0.01 wt %.

2. The semiconductor device according to claim 1, wherein said predetermined additive element is Al, Si, Ge, Ga or Sn, the first barrier metal is formed along, a side wall of the via, and a bottom of the via, and the second barrier metal is formed along the first barrier metal, the side wall of the via, and the bottom of the via.

3. The semiconductor device according to claim 1, wherein a material of said first barrier metal film is TaN, TaSiN, TiN or WN, and a material of said second barrier metal film is Ta, Ti, or W.

4. The semiconductor device according to claim 1, wherein said interlayer insulation film contains an SiOC film.

5. The semiconductor device according to claim 1, further comprising:

a second copper alloy wiring provided in said interlayer insulation film above said first copper alloy wiring and electrically connected to the upper surface of said via, wherein each of said first copper alloy wiring, said second copper alloy wiring and said via contains the predetermined additive element in a main component Cu.

6. The semiconductor device according to claim 1, wherein said first barrier metal film is in contact with said interlayer insulation film, between said interlayer insulation film and said via.

7. The semiconductor device according to claim 6, further comprising a wiring provided in said interlayer insulation film above said first copper alloy wiring and electrically connected to the upper surface of said via, wherein said first barrier metal film is formed between said interlayer insulation film and said wiring, and is in contact with said interlayer insulation film, and said second barrier metal film is formed between said interlayer insulation film and said wiring, and is in contact with said wiring.

8. The semiconductor device according to claim 1, wherein the concentration of nitrogen contained in said first barrier metal film is not less than 10 atom % but more than 40 atom %.

9. The semiconductor device according to claim 6, wherein the film thickness of said first barrier metal film is not less than 1 nm but not more than 10 nm.

10. The semiconductor device according to claim 7, wherein the film thickness of said first barrier metal film is not less than 1 nm but not more than 10 nm.

11. A semiconductor device comprising:

a first copper alloy wiring which contains a predetermined additive element in a main component Cu and is formed in a first interlayer insulation film;

a first insulation film formed on the first copper alloy wiring and the first interlayer insulation film;

a second interlayer insulation film formed on said first insulation film;

a via hole which penetrates the second interlayer insulation film and the first insulation film and exposes a top portion of the first copper alloy wiring;

a trench which is formed in the second interlayer insulation film and is arranged on the via hole;

a first barrier metal which is formed on a side wall of the via hole, a bottom portion of the trench, a side wall of the trench, and the top portion of the first copper alloy wiring, contains nitrogen, and connects with the top portion of the first copper alloy wiring;

a second barrier metal which is formed on the first barrier metal; and a copper alloy metal which is formed on the second barrier metal, contains the predetermined additive element in a main component Cu, and fills the via hole and trench, wherein each of the first and second barrier metals is formed at a connection portion of the bottom of the via, and a concentration of the predetermined additive element is not more than 0.04 wt %, and is not less than 0.01 wt %.

12. The semiconductor device according to claim 11, wherein the predetermined additive element is Al, Si, Ge, Ga or Sn, the second barrier metal is formed along the first barrier metal, the side wall of the via, the bottom of the via hole, the side wall of the trench, and the bottom of the trench, and the top portion of the first copper alloy wiring is connected to the bottom of the via.

13. The semiconductor device according to claim 11, wherein a material of said first barrier metal is TaN, TaSiN, TiN or WN, and a material of said second barrier metal film is Ta, Ti or W.

14. The semiconductor device according to claim 11, wherein said first and second interlayer insulation film each contain an SiOC film.

15. A semiconductor device according to claim 11, wherein a concentration of nitrogen included in the second barrier metal is less than a concentration of nitrogen included in the first barrier metal.

* * * * *